(12) United States Patent
Yu et al.

(10) Patent No.: US 10,998,476 B2
(45) Date of Patent: May 4, 2021

(54) LIGHT-EMITTING DEVICE PACKAGE

(71) Applicant: LG INNOTEK CO., LTD., Seoul (KR)

(72) Inventors: Dong Hyun Yu, Seoul (KR); Bong Kul Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 243 days.

(21) Appl. No.: 16/355,012

(22) Filed: Mar. 15, 2019

(65) Prior Publication Data

US 2019/0259929 A1    Aug. 22, 2019

Related U.S. Application Data

(63) Continuation of application No. 15/744,698, filed as application No. PCT/KR2016/007773 on Jul. 18, 2016, now Pat. No. 10,424,704.

(30) Foreign Application Priority Data

Jul. 16, 2015    (KR) ........................ 10-2015-0100967

(51) Int. Cl.
*H01L 33/36*    (2010.01)
*H01L 33/52*    (2010.01)
(Continued)

(52) U.S. Cl.
CPC ............ *H01L 33/60* (2013.01); *H01L 25/167* (2013.01); *H01L 33/486* (2013.01); *H01L 33/52* (2013.01);
(Continued)

(58) Field of Classification Search
CPC ....... H01L 33/486; H01L 33/62; H01L 33/54; H01L 33/58
See application file for complete search history.

(56) References Cited

U.S. PATENT DOCUMENTS 8,188,498 B2    5/2012    Kim et al.
8,440,477 B1    5/2013    Lo
(Continued)

FOREIGN PATENT DOCUMENTS

CN    103915542 A    7/2014
EP    2 750 212 A1    7/2014
(Continued)

OTHER PUBLICATIONS

Machine_translation_of_KR1020140029617A pdf document (Year: 2014).*
(Continued)

*Primary Examiner* — Brian Turner
(74) *Attorney, Agent, or Firm* — Birch, Stewart, Kolasch & Birch, LLP

(57) ABSTRACT

A light-emitting device package includes a first lead frame; a second lead frame separated from the first lead frame in a first direction; a package body having a cavity exposing a portion of the second lead frame. Further, the cavity includes an inclined inner surface inclining with respect to an upper surface of the second lead frame; a light-emitting diode disposed on the exposed portion of the second lead frame; a hole in the inclined inner surface of the cavity and exposing a portion of the first lead frame; a protection device disposed in the hole and on the exposed portion of the first lead frame; a first wire having a first end connected to the light-emitting diode, and a second end connected to the first lead frame; a second wire having a first end connected to the light-emitting diode, and a second end connected to the second lead frame; and a third wire having a first end connected to the protection device, and a second end connected to the exposed portion of the second lead frame.

30 Claims, 11 Drawing Sheets

(51) Int. Cl.
    *H01L 33/64* (2010.01)
    *H01L 33/62* (2010.01)
    *H01L 33/54* (2010.01)
    *H01L 33/60* (2010.01)
    *H01L 25/16* (2006.01)
    *H01L 33/48* (2010.01)

(52) U.S. Cl.
    CPC .............. *H01L 33/62* (2013.01); *H01L 33/36* (2013.01); *H01L 2224/16245* (2013.01); *H01L 2224/48247* (2013.01); *H01L 2224/8592* (2013.01); *H01L 2924/181* (2013.01)

(56) References Cited

U.S. PATENT DOCUMENTS

| | | |
|---|---|---|
| 2004/0056265 A1 | 3/2004 | Arndt et al. |
| 2007/0029564 A1 | 2/2007 | Han et al. |
| 2008/0142831 A1 | 6/2008 | Su |
| 2008/0169540 A1 | 7/2008 | Shih |
| 2010/0133560 A1 | 6/2010 | Kim et al. |
| 2012/0106118 A1 | 5/2012 | Liaw et al. |
| 2012/0146084 A1 | 6/2012 | Chang et al. |
| 2012/0181559 A1 | 7/2012 | Park et al. |
| 2012/0205712 A1 | 8/2012 | Hayashi |
| 2012/0267654 A1 | 10/2012 | Lee et al. |
| 2012/0275186 A1* | 11/2012 | Min ............... H01L 25/167 362/607 |
| 2015/0171282 A1 | 6/2015 | Wakaki et al. |

FOREIGN PATENT DOCUMENTS

| | | |
|---|---|---|
| JP | 5034686 B2 | 9/2012 |
| JP | 2013-138204 A | 7/2013 |
| JP | 2015-119011 A | 6/2015 |
| KR | 10-2008-0088201 A | 10/2008 |
| KR | 10-2009-0044306 A1 | 5/2009 |
| KR | 10-2010-0096581 A | 9/2010 |
| KR | 10-2010-0103587 A | 9/2010 |
| KR | 10-1007131 B1 | 1/2011 |
| KR | 10-2011-0067388 A | 6/2011 |
| KR | 10-1064072 B1 | 9/2011 |
| KR | 10-2012-0030475 A | 3/2012 |
| KR | 10-2012-0079668 A | 7/2012 |
| KR | 10-2013-0054866 A | 5/2013 |
| KR | 10-1337599 B1 | 12/2013 |
| KR | 10-2014-0029617 A | 3/2014 |
| KR | 10-2014-0128631 A | 11/2014 |
| KR | 10-1633046 B1 | 6/2016 |
| KR | 10-1923688 B1 | 11/2018 |
| WO | WO 2008/081794 A1 | 7/2008 |
| WO | WO 2008/081794 A2 | 7/2012 |

OTHER PUBLICATIONS

Seoul Semiconductor, "Enabling the best lm/W in Mid Power Range," Product Data Sheet, Mid-Power LED—5630 Series, Rev0. 3, May 2014, 31 pages.
KR20140029617A—A light emitting device package—Google Patents (Year: 2014).
KR20140029617A Google translation (Year: 2014).

* cited by examiner

LIGHT-EMITTING DEVICE PACKAGE

CROSS-REFERENCE TO RELATED APPLICATIONS

This application is a Continuation of co-pending U.S. patent application Ser. No. 15/744,698 filed on Jan. 12, 2018, which is the National Phase of PCT International Application No. PCT/KR2016/007773 filed on Jul. 18, 2016, which claims the priority benefit under 35 U.S.C. § 119(a) to Korean Patent Application No. 10-2015-0100967 filed in the Republic of Korea on Jul. 16, 2015, all of which are hereby expressly incorporated by reference into the present application.

BACKGROUND OF THE INVENTION

Field of the Invention

Embodiments relate to light-emitting device packages.

Discussion of the Related Art

Light-emitting devices such as light-emitting diodes (LEDs) or laser diodes (LDs) using group III-V or II-VI compound semiconductors may realize various colors of light such as, for example, red, green, and blue light, as well as ultraviolet light, thanks to the development of device materials and thin-film growth technique, and may also realize white light having high luminous efficacy by using a fluorescent material or by combining colors. These light-emitting devices have advantages of low power consumption, a semi-permanent lifespan, fast response speed, good safety, and eco-friendly properties compared to existing light sources such as, for example, fluorescent lamps and incandescent lamps.

Accordingly, the application of light-emitting devices has been expanded to a transmission module of an optical communication apparatus, a light-emitting diode backlight, which may substitute for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp.

When such light-emitting devices are realized in a package form, the introduction of outside air such as moisture from outside into the light-emitting device package may deteriorate the reliability thereof.

SUMMARY OF THE INVENTION

Embodiments provide a light-emitting device package having increased reliability, rigidity and light extraction efficiency.

To achieve the object described above, an embodiment may include a light-emitting device package including first and second lead frames, an insulation layer disposed between the first and second lead frames to electrically insulate the first and second lead frames from each other, a package body configured to expose a portion of a front surface of at least one of the first or second lead frame, a light-emitting device disposed on the exposed front surface of at least one of the first or second lead frame and having first and second electrodes electrically connected to the respective first and second lead frames, and a Zener diode disposed on the first lead frame so as to be spaced apart from the light-emitting device with the package body interposed therebetween, wherein the package body defines a cavity together with the exposed front surface of at least one of the first or second lead frame, wherein the cavity has an inclined surface configured to reflect light emitted from the light-emitting device, and a lower end of the inclined surface is spaced apart from the light-emitting device, which is disposed on a bottom surface of the cavity, by a predetermined distance, and wherein the package body disposed between the Zener diode and the light-emitting device has a thickness greater than a thickness of the Zener diode or a thickness of the light-emitting device.

For example, the light-emitting device package may further include a first wire having one end electrically connected to the first electrode of the light-emitting device and a remaining end electrically connected to the first lead frame.

For example, the light-emitting device package may further include a second wire having one end electrically connected to the second electrode of the light-emitting device and a remaining end electrically connected to the second lead frame.

For example, the second electrode of the light-emitting device may be directly electrically connected to the second lead frame.

For example, the exposed front surface of the second lead frame may include a first device area in which the light-emitting device is disposed.

For example, the exposed front surface of the second lead frame may further include a first bonding area, which is electrically connected to the remaining end of the second wire and which is close to the first device area.

For example, the package body may include a first groove configured to expose the first bonding area.

For example, the first lead frame may include a second bonding area, which is not covered by the package body and is exposed and which is connected to the remaining end of the first wire.

For example, the package body may include a second groove configured to expose the second bonding area.

For example, the package body may include a first blind hole configured to expose the second bonding area.

For example, the package body may be configured to cover a portion of the insulation layer and expose a remaining portion, and the light-emitting device package may further include a first solder portion disposed between the first electrode of the light-emitting device and the first lead frame, which is close to the remaining portion of the insulation layer, and a second solder portion disposed between the second electrode of the light-emitting device and the second lead frame, which is close to the remaining portion of the insulation layer.

For example, the light-emitting device package may further include a third wire having one end electrically connected to the Zener diode and a remaining end electrically connected to the second lead frame.

For example, the exposed front surface of the second lead frame may include a third bonding area connected to the remaining end of the third wire.

For example, the package body may include a third groove configured to expose the third bonding area.

For example, the first lead frame may include a second device area in which the Zener diode is disposed.

For example, the package body may include a second blind hole configured to expose a portion that is to be connected to the one end of the third wire.

For example, the second blind hole may expose only a portion of the Zener diode that is connected to the one end of the third wire, or may expose the second device area.

For example, in the front surface of the first lead frame, the second bonding area and the second device area may be disposed so as to be spaced apart from each other, or may be disposed so as to be closely connected to each other.

For example, at least a portion of the insulation layer that is covered with the package body may have a first planar area, which is equal to or greater than a second planar area of an exposed remaining portion of the insulation layer that is not covered by the package body.

For example, the package body may define the cavity together with the exposed front surface of at least one of the first or second lead frame and may include the inclined surface configured to reflect the light emitted from the light-emitting device, and the light-emitting device may be disposed inside the cavity.

For example, the inclined surface may has reflectance higher than reflectance of the exposed front surface of at least one of the first or second lead frame.

For example, the predetermined distance may be 30 μm, the thickness of the package body disposed between the Zener diode and the light-emitting device may be greater than 50 μm and is equal to or less than 200 μm, and the inclined surface may have a concave shape, a convex shape, or a stepped shape toward the cavity.

For example, the package body may further include a stepped portion disposed between the lower end of the inclined surface and the bottom surface of the cavity.

For example, the light-emitting device may include first and second conductive semiconductor layers and an active layer disposed between the first and second conductive semiconductor layers, and a first height from the bottom surface of the cavity to a top surface of the stepped portion may be smaller than a second height from the bottom surface of the cavity to the active layer.

For example, the first lead frame may include a first lateral portion protruding from one side surface of the package body, and the second lead frame may include a second lateral portion protruding from a side surface opposite to the one side surface of the package body.

For example, a top surface of the first lead frame, a top surface of the second lead frame, and a top surface of the insulation layer may be located on the same horizontal plane.

For example, a first thickness of the first lead frame, a second thickness of the insulation layer, and a third thickness of the second lead frame may be the same.

For example, a minimum value of a sum of the first, second, or third thickness and a fourth thickness of the package body, which is disposed on the insulation layer and the first lead frame, may be 250 μm.

The package body may include an insulating material, and the insulation layer and the package body may be integrally formed with each other.

A light-emitting device package according to embodiments may achieve an increase in reliability by increasing the length of a path along which outside air is introduced into a cavity from the outside, and may achieve an increase in structural rigidity while reducing the thickness of lead frames.

BRIEF DESCRIPTION OF THE DRAWINGS

FIG. 8 illustrates a cross-sectional view taken along line A-A' illustrated in FIG. 6a.

FIG. 9 illustrates a cross-sectional view taken along line B-B' illustrated in FIG. 6a.

DETAILED DESCRIPTION OF THE EMBODIMENTS

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when a device is referred to as being formed "on" or "under" another device, it can be directly "on" or "under" the other device or be indirectly formed with intervening devices therebetween. It will also be understood that "on" or "under" the device may be described relative to the drawings.

In addition, relative terms such as, for example, "first", "second", "on/upper/above" and "beneath/lower/below", used in the following description may be used to distinguish any one substance or device with another substance or device without requiring or containing any physical or logical relationship or sequence between these substances or devices.

Although light-emitting device packages 100A, 100B and 100C according to embodiments will be described using the Cartesian coordinate system, they may of course be described using other coordinate systems. With the Cartesian coordinate system, the x-axis, the y-axis and the z-axis may be orthogonal to one another, or may cross one another.

Figure 1:
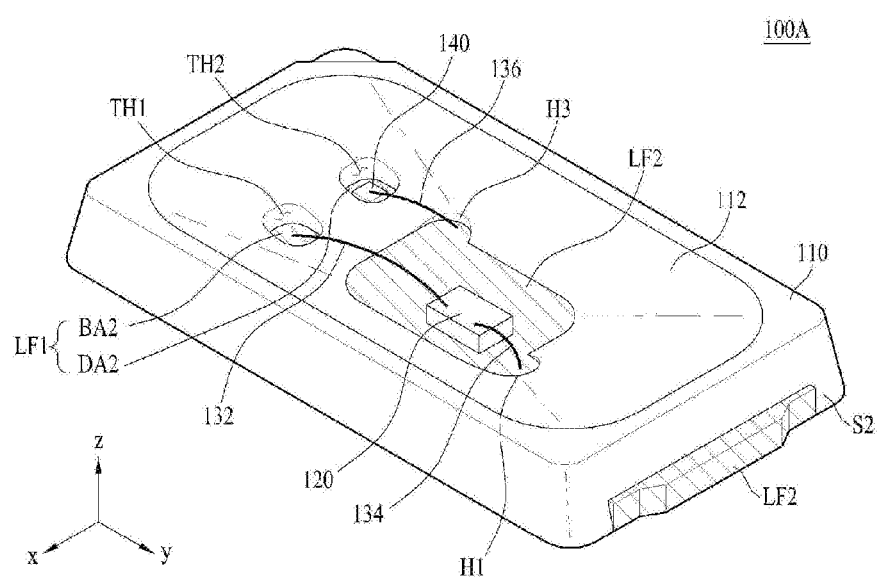
FIG. 1 illustrates a top perspective view of a light-emitting device package according to an embodiment.
Figure 2:
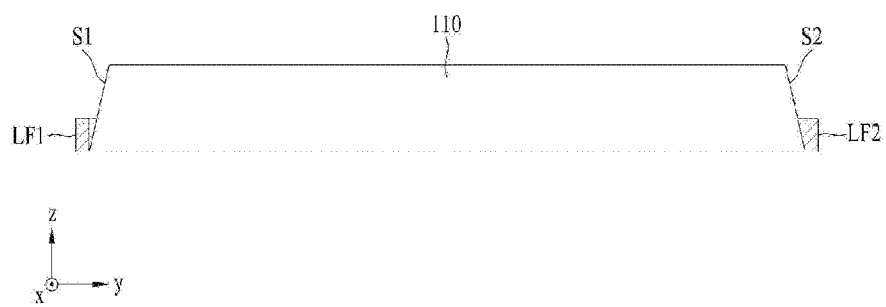
FIG. 2 illustrates a front view of the light-emitting device package illustrated in FIG. 1.
Figure 3:
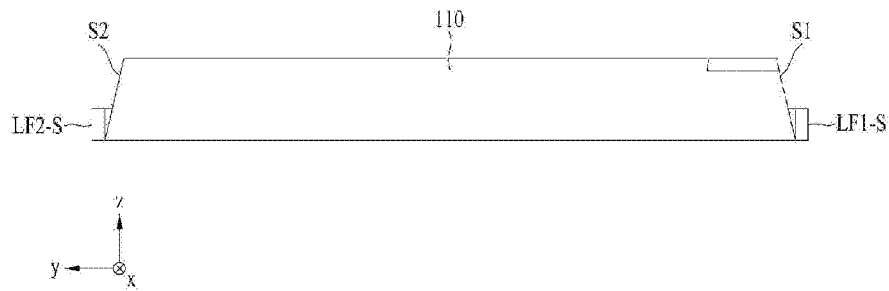
FIG. 3 illustrates a rear view of the light-emitting device package illustrated in FIG. 1.
Figure 4:
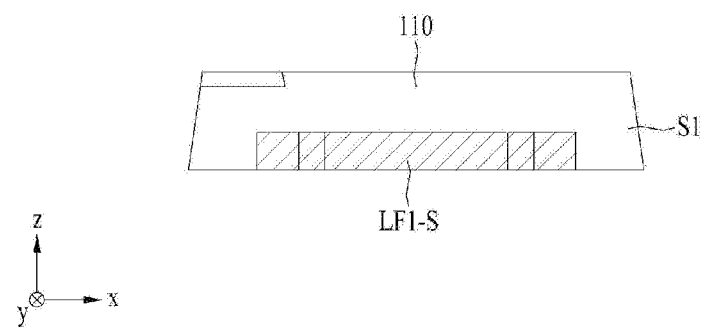
FIG. 4 illustrates a left side view of the light-emitting device package illustrated in FIG. 1.
Figure 5:
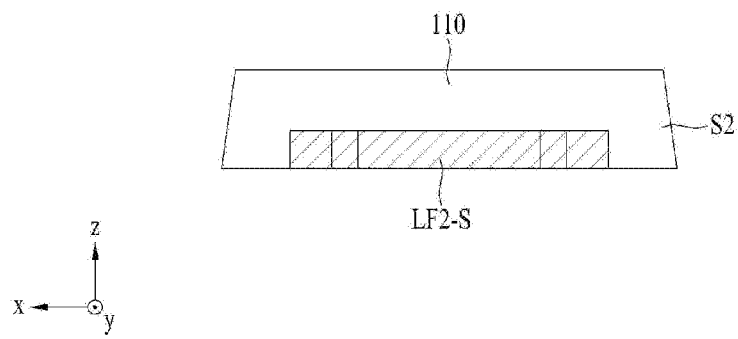
FIG. 5 illustrates a right side view of the light-emitting device package illustrated in FIG. 1.
Figure 6A:
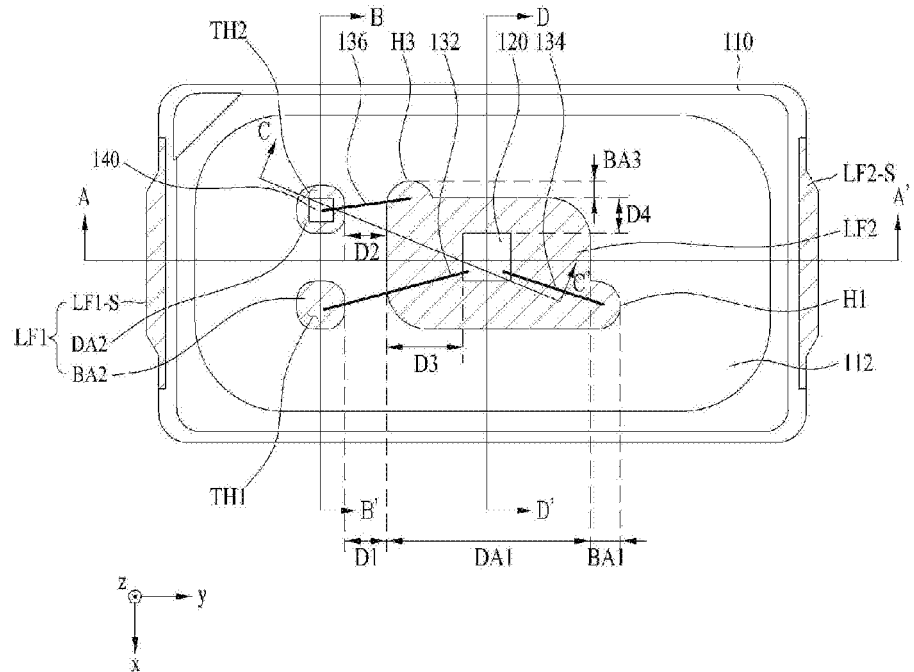
FIGS. 6a and 6b illustrate plan views illustrating embodiments of the light-emitting device package illustrated in FIG. 1.
Figure 6B:
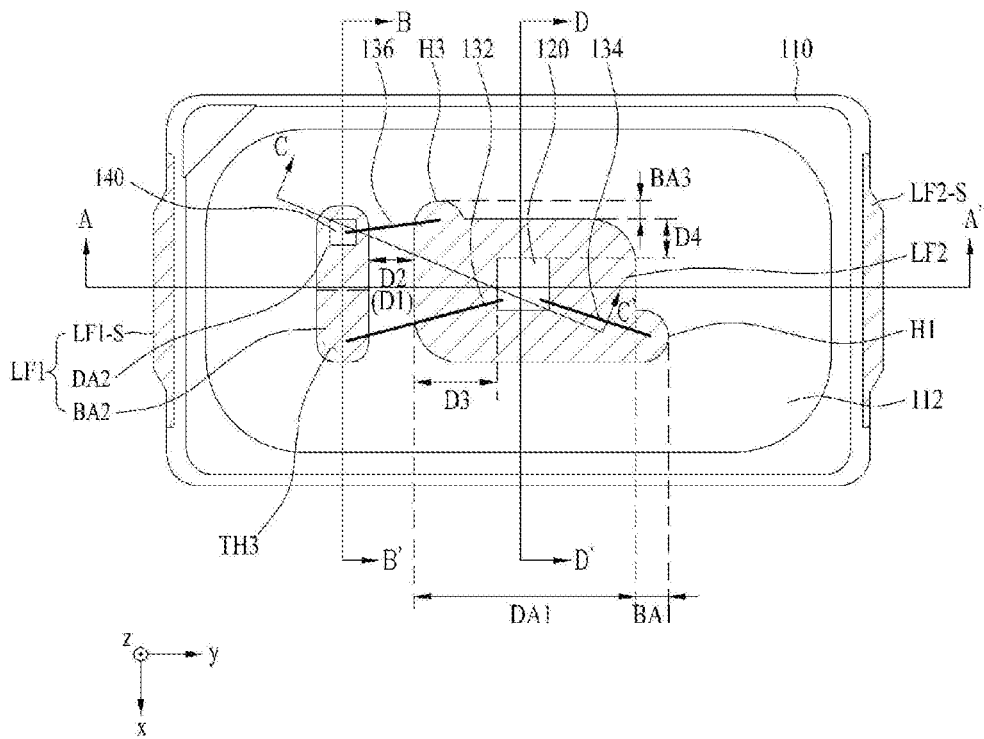
Figure 7:
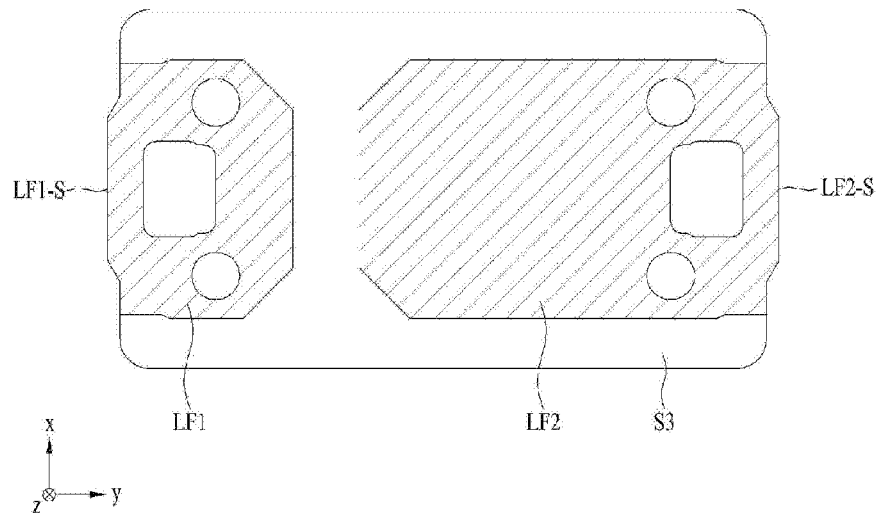
FIG. 7 illustrates a bottom view of an embodiment of the light-emitting device package illustrated in FIG. 1.
Figure 8:
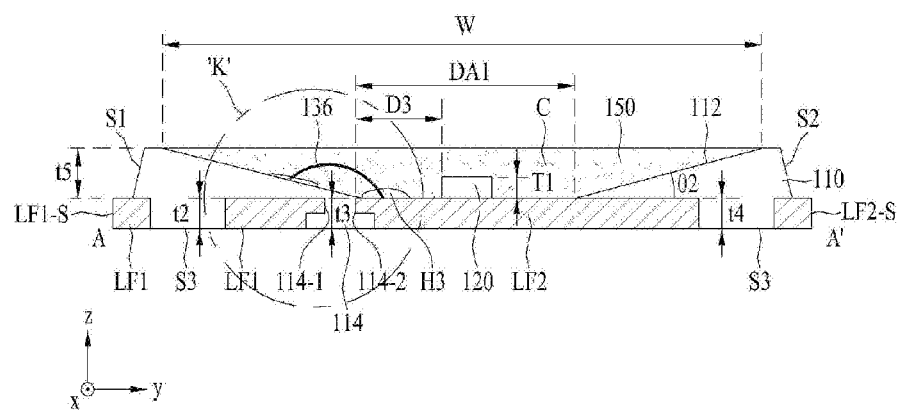
Figure 9:
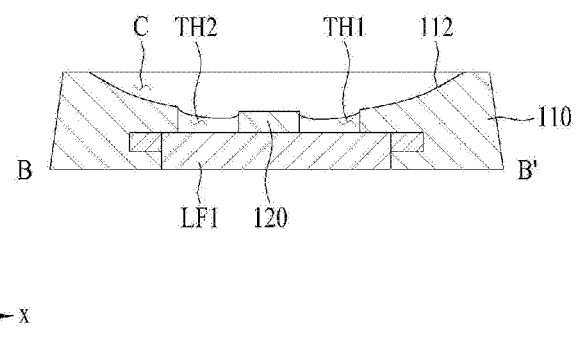

FIG. 1 illustrates a top perspective view of a light-emitting device package 100A according to an embodiment, FIG. 2 illustrates a front view of the light-emitting device package 100A illustrated in FIG. 1, FIG. 3 illustrates a rear view of the light-emitting device package 100A illustrated in FIG. 1, FIG. 4 illustrates a left side view of the light-emitting device package 100A illustrated in FIG. 1, FIG. 5 illustrates a right side view of the light-emitting device package 100A illustrated in FIG. 1, FIG. 6a illustrates a plan view illustrating an embodiment of the light-emitting device package 100A illustrated in FIG. 1, FIG. 6b illustrates a plan view illustrating another embodiment of the light-emitting device package 100A illustrated in FIG. 1, FIG. 7 illustrates a bottom view of an embodiment of the light-emitting device package 100A illustrated in FIG. 1, FIG. 8 illustrates a cross-sectional view taken along line A-A' illustrated in FIG. 6a, and FIG. 9 illustrates a cross-sectional view taken along line B-B' illustrated in FIG. 6a.

Hereinafter, the light-emitting device package 100A according to an embodiment will be described with reference to FIGS. 1 to 9, but the embodiment is not limited thereto. That is, the light-emitting device package 100A illustrated in FIG. 1 may have plan views and cross-sectional views different from the plan views and the cross-sectional views illustrated respectively in FIGS. 6a, 6b, 8 and 9. The light-emitting device package 100A illustrated in FIGS. 6a and 6b may have a perspective view and cross-sectional views different from the perspective view and the cross-sectional views illustrated in FIGS. 1, 8 and 9, and the light-emitting device package 100A illustrated in FIGS. 8 and 9 may have a perspective view and plan views different from the perspective view and the plan views illustrated in FIGS. 1, 6a and 6b.

The light-emitting device package 100A according to an embodiment may include two lead frames LF1 and LF2, a package body 110, an insulation layer 114, a light-emitting device 120, first to third wires 132, 134 and 136, a Zener diode (ZD) 140, and a molding member 150.

The two lead frames LF1 and LF2 may be disposed so as to be electrically separated from each other. To this end, the insulation layer 114 may be disposed between the two lead frames LF1 and LF2 so as to electrically insulate the two lead frames LF1 and LF2 from each other. The two lead frames LF1 and LF2 may be disposed so as to be spaced apart from each other along the y-axis.

The insulation layer 114 may include at least one of $SiO_2$, $TiO_2$, $ZrO_2$, $Si_3N_4$, $Al_2O_3$ or $MgF_2$, but the embodiment is not limited as to the material of the insulation layer 114.

In addition, the insulation layer 114 and the package body 110 may be separate layers, but the embodiment is not limited thereto. That is, when the package body 110 includes an insulation material having an electrical insulation property, the insulation layer 114 and the package body 110 may be integrally formed with each other.

The light-emitting device 120 may be disposed on any one lead frame among the two lead frames. Hereinafter, in the description of FIGS. 1 to 15, among the two lead frames, the lead frame on which the light-emitting device 120 is disposed is referred to as a "second lead frame LF2" and the lead frame on which the light-emitting device 120 is not disposed is referred to as a "first lead frame LF1". Here, the second lead frame LF2 may include a first device area DA1. The first device area DA1 may be defined as an area, in which the light-emitting device 120 may be disposed, of the front surface of the second lead frame LF2, which is not covered by the package body 110 and is exposed. Since the first device area DA1 is an exposed area for allowing the light-emitting device 120 to be disposed thereon, the surface area thereof may be determined by the size of the light-emitting device 120.

Referring to FIGS. 2 to 4 and 6a to 8, the first lead frame LF1 may include a first lateral portion LF1-S. The first lateral portion LF1-S may be shaped so as to protrude from one side surface S1 among multiple side surfaces of the package body 110. In addition, referring to FIGS. 1 to 3 and 5 to 8, the second lead frame LF2 may include a second lateral portion LF2-S. The second lateral portion LF2-S may be shaped so as to protrude from the side surface S2 opposite the side surface S1 of the package body 110. However, the embodiment is not limited as to the specific shape of the first and second lateral portions LF1-S and LF2-S.

In addition, as illustrated in FIG. 7, each of the first lead frame LF1 and the second lead frame LF2 may be exposed from a lower surface S3 of the package body 110.

Each of the first and second lead frames LF1 and LF2 may be formed using a conductive material such as a metal, for example, one of titanium (Ti), copper (Cu), nickel (Ni), gold (Au), chrome (Cr), tantalum (Ta), platinum (Pt), tin (Sn), silver (Ag), and phosphor (P) or alloys thereof, and may be formed in a single layer or in multiple layers.

In the light-emitting device package 100A according to the embodiment illustrated in FIG. 1, the light-emitting device 120 may be a horizontal bonding-type light-emitting diode, without limitation thereto. That is, the light-emitting device 120 may be a vertical bonding-type light-emitting diode or a flip-chip-bonding-type light-emitting diode. For example, unlike the light-emitting device package 100A according to the embodiment in which the package body 110 covers the entire upper surface of the insulation layer 114, in the case of light-emitting device packages 100B and 100C according to other embodiments, the package body 110 may expose a portion of the insulation layer 114. For example, in the light-emitting device package 100C in which the package body 110 exposes a portion of the insulation layer 114 as will be described below, a light-emitting device 120C included therein may be a flip-chip-bonding-type light-emitting diode.

In addition, the light-emitting device 120 may be a light-emitting diode that emits, for example, red, green, blue or white light, but the embodiment is not limited thereto. Alternatively, the light-emitting device 120 may be an ultraviolet (UV) light-emitting diode that emits ultraviolet light, without limitation thereto.

Figure 10A:
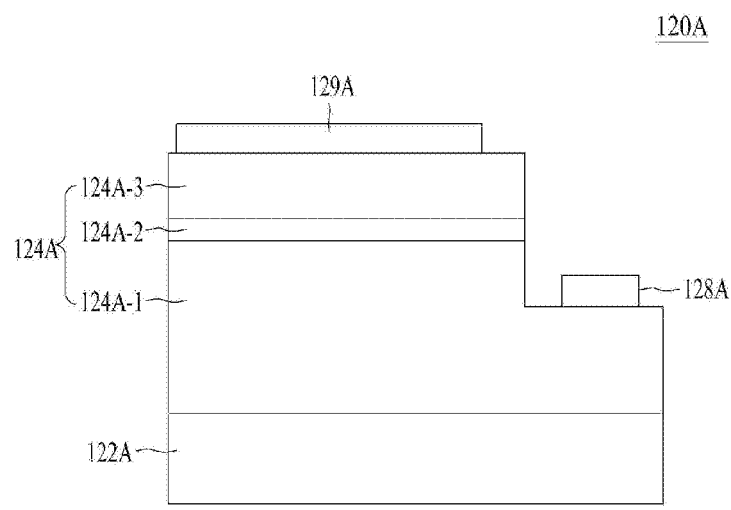
FIGS. 10a and 10b illustrate cross-sectional views of an embodiment of the light-emitting devices illustrated respectively in FIGS. 1, 6a, 6b, 8 and 9.

FIG. 10a illustrates a cross-sectional view of an embodiment 120A of the light-emitting device 120 illustrated in each of FIGS. 1, 6a, 6b, 8 and 9.

Referring to FIG. 10a, the light-emitting device 120A may include a substrate 122A, a light-emitting structure 124A, a first electrode 128A, and a second electrode 129A.

The substrate 122A may be disposed on the first device area DA1 in the exposed front surface of the second lead frame LF2. The substrate 122A may be formed of a material that is suitable for the growth of semiconductor materials, for example, a carrier wafer. In addition, the substrate 122A may be formed of a material having excellent thermal conductivity. The substrate 122A may be a material including at least one of sapphire (Al$_2$O$_3$), GaN, SiC, ZnO, Si, GaP, InP, Ga$_2$O$_3$, or GaAs, but the embodiment is not limited as to the material of the substrate 122A. In addition, the substrate 122A may have a concave-and-convex pattern (not illustrated) formed in the upper surface thereof.

In order to reduce the difference in the coefficients of thermal expansion (CTEs) and to improve lattice mismatching between the substrate 122A and the light-emitting structure 124A, a buffer layer (or a transition layer) (not illustrated) may further be disposed between the same 122A and 124A. The buffer layer may include at least one material selected from the group consisting of Al, In, N and Ga, without limitation thereto. In addition, the buffer layer may be formed in a single layer or in multiple layers.

The light-emitting structure 124A may be disposed on the substrate 122A. The light-emitting structure 124A may include a first conductive semiconductor layer 124A-1, an active layer 124A-2, and a second conductive semiconductor layer 124A-3, which are sequentially disposed on the substrate 122A.

The first conductive semiconductor layer 124A-1 is disposed on the substrate 122A. The first conductive semiconductor layer 124A-1 may be formed of, for example, group III-V or group II-VI compound semiconductors and may be doped with a first conductive dopant. When the first conductive semiconductor layer 124A-1 is an n-type semiconductor layer, the first conductive dopant may be an n-type dopant including Si, Ge, Sn, Se or Te, without limitation thereto.

For example, the first conductive semiconductor layer 124A-1 may include a semiconductor material having a composition equation of Al$_x$In$_y$Ga$_{(1-x-y)}$N (0≤x≤1, 0≤y≤1, 0≤x+y≤1). The first conductive semiconductor layer 124A-1 may include one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 124A-2 may be disposed between the first conductive semiconductor layer 124A-1 and the second conductive semiconductor layer 124A-3. The active layer 124A-2 is a layer in which electrons (or holes) introduced through the first conductive semiconductor layer 124A-1 and holes (or electrons) introduced through the second conductive semiconductor layer 124A-3 meet each other in order to emit light having energy determined by the intrinsic energy band of a material constituting the active layer 124A-2. The active layer 124A-2 may have at least one of a single well structure, a multi-well structure, a single quantum well structure, a multi quantum well (MOW) structure, a quantum wire structure, or a quantum dot structure.

The well layer/barrier layer of the active layer 124A-2 may have one or more paired structure of InGaN/GaN, InGaN/InGaN, GaN/AlGaN, InAlGaN/GaN, GaAs(InGaAs)/AlGaAs, and GaP(InGaP)/AlGaP, without limitation thereto. The well layer may be formed of a material having band-gap energy lower than the band-gap energy of the barrier layer.

A conductive clad layer (not illustrated) may be formed on and/or under the active layer 124A-2. The conductive clad layer may be formed of semiconductors having band-gap energy higher than the band-gap energy of the barrier layer of the active layer 124A-2. For example, the conductive clad layer may include GaN, AlGaN, InAlGaN, or a super-lattice structure. In addition, the conductive clad layer may be n-type or p-type doped.

The embodiment is not limited as to the wavelength band of light emitted from the active layer 124A-2.

The second conductive semiconductor layer 124A-3 may be disposed on the active layer 124A-2. The second conductive semiconductor layer 124A-3 may be formed of compound semiconductors, and may be formed of, for example, group III-V or group II-VI compound semiconductors. For example, the second conductive semiconductor layer 124A-3 may include a semiconductor material having a composition equation of In$_x$Al$_y$Ga$_{(1-x-y)}$N (0≤x≤1, 0≤y≤1, 0≤x+y≤1). The second conductive semiconductor layer 124A-3 may be doped with a second conductive dopant. When the second conductive semiconductor layer 124A-3 is a p-type semiconductor layer, the second conductive dopant may be a p-type dopant and may include, for example, Mg, Zn, Ca, Sr, or Ba.

The first conductive semiconductor layer 124A-1 may be formed as an n-type semiconductor layer, and the second conductive semiconductor layer 124A-3 may be formed as a p-type semiconductor layer. Alternatively, the first conductive semiconductor layer 124A-1 may be formed as a p-type semiconductor layer, and the second conductive semiconductor layer 124A-3 may be formed as an n-type semiconductor layer.

The light-emitting structure 124A may be formed to have one of an n-p junction structure, a p-n junction structure, an n-p-n junction structure, and a p-n-p junction structure.

The first electrode 128A may be disposed on the first conductive semiconductor layer 124A-1, which is exposed by mesa etching. That is, the first conductive semiconductor layer 124A-1 may be exposed by mesa-etching a portion of the second conductive semiconductor layer 124A-3, the active layer 124A-2, and the first conductive semiconductor layer 124A-1.

When the first electrode 128A may include an ohmic contact material so as to perform an ohmic function, it may be not necessary to dispose a separate ohmic layer (not illustrated). Alternatively, a separate ohmic layer may be disposed on or under the first electrode 128A.

The second electrode 129A may be disposed on the second conductive semiconductor layer 124A-3 and may be electrically connected to the second conductive semiconductor layer 124A-3. The second electrode 129A may include a transparent electrode layer (not illustrated). The transparent electrode layer may be a transparent conductive oxide (TCO) layer. For example, the transparent electrode layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, without limitation thereto.

The second electrode 129A may have ohmic characteristics, and may include a material for ohmic contact with the second conductive semiconductor layer 124A-3. When the second electrode 129A performs an ohmic function, no separate ohmic layer (not illustrated) may be formed.

Each of the first and second electrodes 128A and 129A may be formed of a material, which may not absorb, but may transmit light emitted from the active layer 124A-2 and which may be grown to have a high quality on the first and second conductive semiconductor layers 124A-1 and 124A-3. For example, each of the first and second electrodes 128A and 129A may be formed of a metal, and may be formed of Ag, Ni, Al, Rh, Pd, Ir, Ru, Mg, Zn, Pt, Au, Hf, or selective combinations thereof.

Figure 10B:
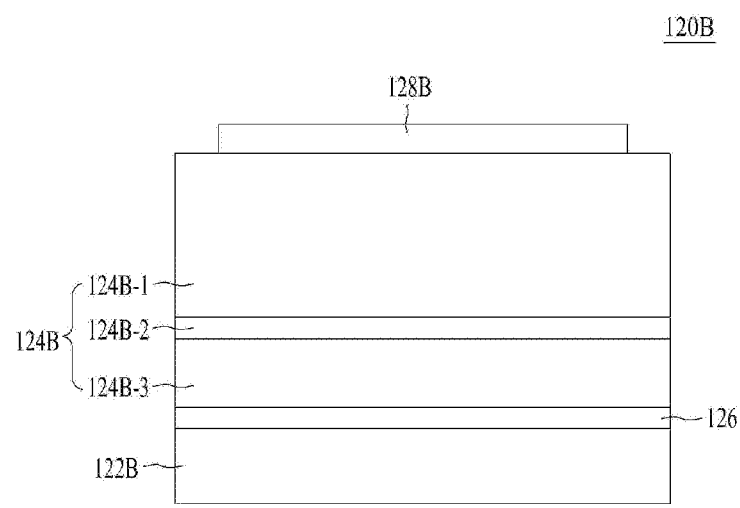

FIG. 10b illustrates a cross-sectional view of another embodiment 120B of the light-emitting device 120 illustrated in each of FIGS. 1, 6a, 6b, 8 and 9.

Referring to FIG. 10b, the light-emitting device 120B may include a supporting substrate 122B, a reflective layer 126, a light-emitting structure 124B, and a first electrode 128B.

The supporting substrate 122B supports the light-emitting structure 124B. The supporting substrate 122B may be formed of a metal or a semiconductor material. In addition, the supporting substrate 122B may be formed of a material having high electrical and thermal conductivity. For example, the supporting substrate 122B may be a metal material including at least one of copper (Cu), copper (Cu) alloy, gold (Au), nickel (Ni), molybdenum (Mo), or copper-tungsten (Cu—W), or may be semiconductors including at least one of Si, Ge, GaAs, ZnO, or SiC.

The reflective layer 126 may be disposed on the supporting substrate 122B. The supporting substrate 122B may perform a role corresponding to that of the second electrode 129A illustrated in FIG. 10a.

The reflective layer 126 serves to reflect light, which is emitted from the active layer 124B-2 of the light-emitting structure 124B and is directed to the supporting substrate 122B, rather than being emitted upward. That is, the reflective layer 126 may reflect light introduced from the light-emitting structure 124B, thereby increasing the light extraction efficiency of the light-emitting device 120B. The reflective layer 126 may be formed of a light reflection material, for example, a metal or an alloy including at least one or Ag, Ni, Al, Rh, Pd, Ir, Ru, Mg, Zn, Pt, Au or Hf, but the embodiment is not limited thereto.

The reflective layer 126 may be formed in multiple layers using a light-transmitting conductive material such as a metal or alloy, or IZO, IZTO, IAZO, IGZO, IGTO, AZO, or ATO, and for example, may be formed of IZO/Ni, AZO/Ag, IZO/Ag/Ni, or AZO/Ag/Ni.

Although not illustrated, an ohmic layer (not illustrated) may be disposed between the reflective layer 126 and the second conductive semiconductor layer 124B-3. In this case, the ohmic layer may be in ohmic contact with the second conductive semiconductor layer 124B-3, thereby serving to assist the smooth supply of power to the light-emitting structure 124B.

In the case of FIG. 10b, the light-emitting device 120B is illustrated as including the reflective layer 126, but the embodiment is not limited thereto. That is, the reflective layer 126 may be omitted in some cases.

The light-emitting structure 124B may be disposed on the reflective layer 126. The light-emitting structure 124B may include a second conductive semiconductor layer 124B-3, an active layer 124B-2, and a first conductive semiconductor layer 124B-1, which are sequentially disposed on the reflective layer 126. Here, the first conductive semiconductor layer 124B-1, the active layer 124B-2, and the second conductive semiconductor layer 124B-3 illustrated in FIG. 10b may perform the same functions as those of each of the first conductive semiconductor layer 124A-1, the active layer 124A-2, and the second conductive semiconductor layer 124A-3 illustrated in FIG. 10a, and thus a repeated description thereof will be omitted.

The first electrode 128B may be disposed on the first conductive semiconductor layer 124A-1 of the light-emitting structure 124B. The first electrode 128B may perform a role corresponding to that of the first electrode 128A illustrated in FIG. 10a. The first electrode 128B may have a predetermined pattern shape. The upper surface of the first conductive semiconductor layer 124B-1 may be provided with a pattern (not illustrated) having roughness in order to increase light extraction efficiency. In addition, in order to increase light extraction efficiency, the upper surface of the first electrode 128B may be also provided with a pattern (not illustrated) having roughness.

The light-emitting device 120 illustrated in each of FIGS. 1, 6a, 6b, 8 and 9 may have the structure illustrated in FIG. 10a or FIG. 10b as described above, but the embodiments are not limited thereto. That is, it is to be noted that the light-emitting device 120 included in the light-emitting device package 100A of the embodiment may have a structure different from the structure illustrated in FIG. 10a or FIG. 10b.

The first electrodes 128A and 128B of the light-emitting devices 120, 120A and 120B illustrated respectively in FIGS. 1, 6a, 6b, 8, 9, 10a and 10b may be electrically connected to the first lead frame LF1, and the second electrodes 129A and 129B may be electrically connected to the second lead frame LF2.

Figure 11:
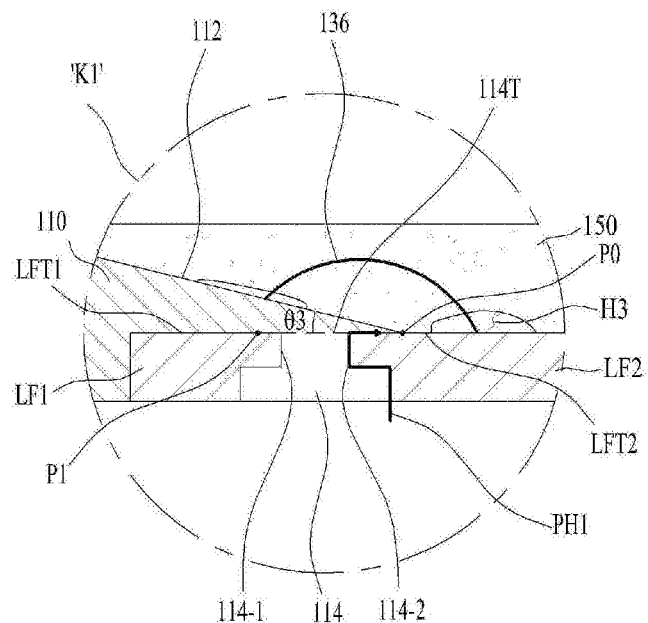
FIG. 11 illustrates an enlarged cross-sectional view of an embodiment of portion "K" illustrated in FIG. 8.

FIG. 11 illustrates an enlarged cross-sectional view of an embodiment K1 of portion "K" illustrated in FIG. 8.

Referring to FIGS. 8 and 11, the package body 110 may cover a first boundary 114-1 between the first lead frame LF1 and the insulation layer 114 and a second boundary 114-2 between the second lead frame LF2 and the insulation layer 114. At this time, as illustrated in FIG. 8, the package body 110 may cover only a region up to the second boundary 114-2, and as illustrated in FIG. 11, the package body 110 may cover a region up to a zero point P0 of the second lead frame LF2 beyond the second boundary 114-2.

In addition, the first electrodes 128A and 128B and the second electrodes 129A and 122B of the light-emitting devices 120, 120A and 120B according to the embodiments may be electrically connected to the first and second lead frames LF1 and LF2 via wires, but the embodiments are not limited thereto.

The first wire 132 serves to electrically connect the first electrodes 128A and 128B of the light-emitting devices 120, 120A and 120B to the first lead frame LF1. To this end, one end of the first wire 132 may be electrically connected to the first electrodes 128A and 128B of the light-emitting devices 120, 120A and 120B, and the other end thereof may be electrically connected to the first lead frame LF1. In this case, the front surface of the first lead frame LF1 may include a second bonding area BA2. The second bonding area BA2 may be an area that is electrically connected to the other end of the first wire 132 on the front surface of the first lead frame LF1, which is not covered by the package body 110 and is exposed. For example, the second bonding area BA2 may be exposed through a first blind hole TH1 illustrated in FIG. 6a (or a third blind hole TH3 illustrated in FIG. 6b), which is included in the package body 110. Since the second bonding area BA2 is an area for the bonding of the first wire 132, the second bonding area BA2 may have a surface area greater than the minimum surface area required for wire bonding.

In addition, the first blind hole TH1 (or the third blind hole TH3) may be spaced apart from the first device area DA1, as illustrated in FIGS. 1, 6a and 6b, but the embodiment is not limited thereto.

When the light-emitting device 120 has a horizontal bonding-type structure as illustrated in FIG. 10a, the second wire 134 serves to electrically connect the second electrode 129A of the light-emitting devices 120 and 120A to the second lead frame LF2. To this end, one end of the second wire 134 may be electrically connected to the second electrode 129A of the light-emitting devices 120 and 120A, and the other end thereof may be electrically connected to the second lead frame LF2. In this case, the front surface of the second lead frame LF2, which is exposed rather than being covered by the package body 110, may include a first bonding area BA1. The first bonding area BA1 may include an area, which is electrically connected to the other end of the second wire 134, of the front surface of the second lead frame LF2. The first bonding area BA1 may be exposed through a first groove H1, which is included in the package body 110. In addition, referring to FIGS. 1, 6a and 6b, the first bonding area BA1 may be disposed close to the first device area DA1, but the embodiment is not limited thereto. That is, the first bonding area BA1 may be disposed so as to extend from the first device area DA1.

In addition, according to another embodiment, when the light-emitting device 120 has a vertical bonding-type structure as illustrated in FIG. 10b, the light-emitting device package 100A may not include the second wire 134. In this case, unlike the illustration of each of FIGS. 1, 6a and 6b, the supporting substrate 122B, which serves as the second electrode in the light-emitting device 120B, may be directly electrically connected to the second lead frame LF2 without a wire.

Meanwhile, the Zener diode 140 may be disposed on the first lead frame LF1 in order to increase the voltage that can be withstood by the light-emitting device package 100A. The third wire 136 serves to electrically connect the Zener diode 140 and the second lead frame LF2 to each other. To this end, one end of the third wire 136 may be electrically connected to the Zener diode 140 and the other end thereof may be electrically connected to the second lead frame LF2. In this case, the front surface of the second lead frame LF2 may include a third bonding area BA3. The third bonding area BA3 may include an area, which is electrically connected to the other end of the third wire 136, of the front surface of the second lead frame LF2. The third bonding area BA3 may be exposed through a third groove H3, which is included in the package body 110. In addition, referring to FIGS. 1, 6a and 6b, the third bonding area BA3 may be disposed close to the first device area DA1, but the embodiment is not limited thereto. That is, the third bonding area BA3 may be disposed so as to extend from the first device area DA1.

Each of the first and third grooves H1 and H3 described above may be recessed in an inclined surface 112 of the package body 110 on the second lead frame LF2. For example, the first groove H1 may be recessed along the y-axis in the inclined surface 112 on the boundary between the first device area DA1 and the first bonding area BA1 of the second lead frame LF2. In addition, the third groove H3 may be recessed along the −x-axis in the inclined surface 112 on the boundary between the first device area DA1 and the third bonding area BA3 of the second lead frame LF2.

Each of the first and third bonding areas BA1 and BA3 described above are areas for the bonding of the second and third wires 134 and 136, and therefore may have a surface area greater than the minimum surface area required for wire bonding. An example of the respective sizes of the first and third bonding areas BA1 and BA3 will be described later.

In addition, the front surface of the first lead frame LF1 may further include a second device area DA2. The second device area DA2 may be defined as an area, which is allotted to dispose the Zener diode 140, of the front surface of the first lead frame LF1. The second device area DA2 is exposed in order to dispose the Zener diode 140 thereon, and therefore, the surface area thereof may be determined by the size of the Zener diode 140. An example of the size of the second device area DA2 will be described later.

In addition, the second bonding area BA2 and the second device area DA2 may be disposed on the front surface of the first lead frame LF1 so as to be spaced apart from each other as illustrated in FIG. 6a, or so as to be in contact with and be connected to each other as illustrated in FIG. 6b. Excluding this difference, the light-emitting device package illustrated in FIG. 6b is the same as the light-emitting device package illustrated in FIG. 6a, and thus a description of the same parts will be omitted and only differences therebetween will be described.

In addition, referring to FIG. 6a, the package body 110 may further include a second blind hole TH2. The second blind hole TH2 may serve to expose a portion to which one end of the third wire 136 is to be connected.

According to an embodiment, as illustrated in FIG. 6a, the second device area DA2 may be exposed through the second blind hole TH2. Alternatively, as illustrated in FIG. 6b, the second device area DA2 may be exposed through the third blind hole TH3. In this case, the Zener diode 140 may be exposed through the second blind hole TH2 (or the third blind hole TH3).

In the case of FIG. 6a, the first and second blind holes TH1 and TH2 are separately formed so as to be spaced apart from each other. In contrast, the package body 110 illustrated in FIG. 6b has therein the third blind hole TH3, which is acquired by integrally interconnecting the first and second blind holes TH1 and TH2 illustrated in FIG. 6a.

According to another embodiment, unlike the illustration of FIGS. 1, 6a and 6b, the second blind hole TH2 (or the third blind hole TH3) may not expose the entire second device area DA2, but may expose only a portion of the Zener diode 140 to which one end of the third wire 136 is connected.

In addition, the second blind hole TH2 (or the third blind hole TH3) may be located so as to be spaced apart from the first device area DA1, as illustrated in FIGS. 1, 6a and 6b, but the embodiment is not limited thereto.

In addition, referring to FIG. 6a, the first blind hole TH1 may be spaced apart from the first device area DA1 by a first predetermined distance D1, and the second blind hole TH2 may be spaced apart from the first device area DA1 by a second predetermined distance D2. In addition, referring to FIG. 6b, the third blind hole TH3 may be spaced apart from the first device area DA1 by the second predetermined distance D2 (or the first predetermined distance D1). Here, a first minimum distance, which is the minimum value of the first predetermined distance D1, and a second minimum distance, which is the minimum value of the second predetermined distance D2, may be the same as or different from each other.

Referring to FIG. 6a, when the first predetermined distance D1 is smaller than 50 µm, it may be difficult to form the first blind hole TH1. For example, when the first blind hole TH1 is formed through an injection process, it may be difficult to perform the injection process when the first predetermined distance D1 is smaller than 50 µm. Therefore, the first predetermined distance D1 may be 50 µm or more, but the embodiment is not limited thereto. Similarly, when the second predetermined distance D2 is smaller than 50 µm, it may be difficult to form the second blind hole TH2. For example, when the second blind hole TH2 is formed through an injection process, it may be difficult to perform the injection process when the second predetermined distance D2 is smaller than 50 µm. Therefore, the second predetermined distance D2 may be 50 µm or more, but the embodiment is not limited thereto.

Referring to FIG. 6b, when the second predetermined distance D2 (or the first predetermined distance D1) is smaller than 50 µm, it may be difficult to form the third blind hole TH3. For example, when the third blind hole TH3 is formed through an injection process, it may be difficult to perform the injection process when the second predetermined distance D2 (or the first predetermined distance D1) is smaller than 50 µm. Therefore, the second predetermined distance D2 (or the first predetermined distance D1) may be 50 µm or more, but the embodiment is not limited thereto.

Figure 12:
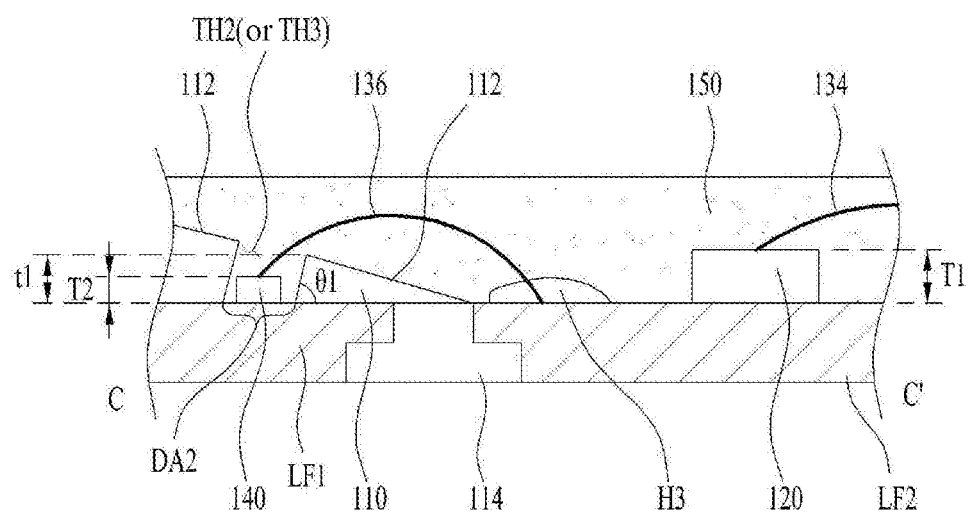
FIG. 12 illustrates a cross-sectional view taken along line C-C' illustrated in FIGS. 6a and 6b.
Figure 13:
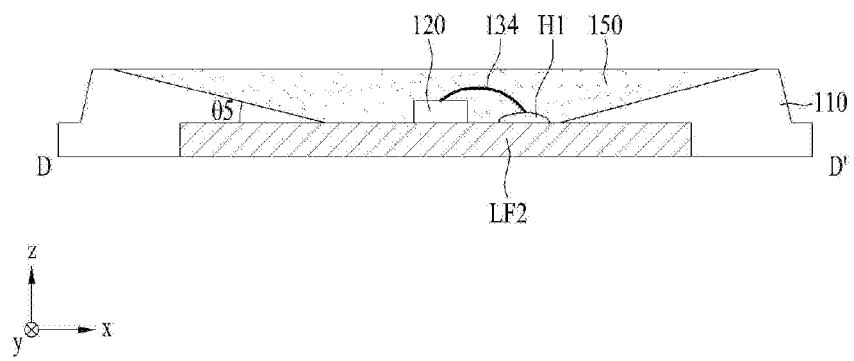
FIG. 13 illustrates a cross-sectional view taken along line D-D' illustrated in FIGS. 6a and 6b.

FIG. 12 illustrates a cross-sectional view taken along line C-C' illustrated in FIGS. 6a and 6b, and FIG. 13 illustrates a cross-sectional view taken along line D-D' illustrated in FIGS. 6a and 6b.

Generally, light emitted from the light-emitting device of the light-emitting device package may be absorbed by the Zener diode, which may reduce the total quantity of light emitted by the light-emitting device package.

However, in the case of the light-emitting device package 100A according to the embodiment, referring to FIG. 12, a first thickness t1 of the package body 110 disposed between the Zener diode 140 and the light-emitting device 120 may be greater than the thickness T1 of the light-emitting device 120 or the thickness T2 of the Zener diode 140. In this case, since the Zener diode 140 is hidden by the package body 110, the light emitted from the light-emitting device 120 is not absorbed by the Zener diode 140, which may increase the light extraction efficiency of the light-emitting device package 100A.

The first thickness t1 may be greater than the thickness T2 of the Zener diode 140. When the thickness T2 of the Zener diode 140 ranges from 50 µm to 100 µm, the first thickness t1 may be greater than 50 µm. In addition, when the first thickness t1 is greater than 200 µm, the bottom surface of the cavity C, which has reflectance lower than that of the inclined surface 112, may be excessively exposed, which may deteriorate the light extraction efficiency thereof. Thus, the first thickness t1 may be greater than 50 µm and equal to or less than 200 µm, but the embodiment is not limited thereto. In addition, in FIG. 6a, the first blind hole TH1 may have a shape suitable for allowing the first wire 132 to be connected to the second bonding area BA2, and the second blind hole TH2 may have a shape suitable for allowing the third wire 136 to be connected to the Zener diode 140. In addition, in FIG. 6b, the third blind hole TH3 may have a shape suitable for allowing the first wire 132 to be connected to the second bonding area BA2 and allowing the third wire 136 to be connected to the Zener diode 140. For example, referring to FIG. 12, the second blind hole TH2 (or the third blind hole TH3) may be vertically formed in a direction that is parallel to the thickness direction (e.g. the z-axis) of the first lead frame LF1, but may be formed to be inclined by a first inclination angle θ1 from the direction that is parallel to the thickness direction of the first lead frame LF1. Although not illustrated, the first blind hole TH1 may be vertically formed in the direction that is parallel to the thickness direction of the first lead frame LF1, or may be formed to be inclined by the first inclination angle θ1, in the same manner as the second blind hole TH2.

When the first to third blind holes TH1, TH2 and TH3 are inclined, the first and third wires 132 and 136 may be more easily introduced into the first to third blind holes TH1, TH2 and TH3.

Meanwhile, according to an embodiment, in the same manner as the light-emitting device package 100A illustrated in FIGS. 1, 6a, 6b, 8, 11 and 12, the package body 110 may cover the entire insulation layer 114, but the embodiment is not limited thereto.

That is, according to another embodiment, the package body 110 may cover only a portion of the insulation layer 114. Thus, according to the embodiment, the package body 110 may cover at least a portion of the insulation layer 114.

Figure 14:
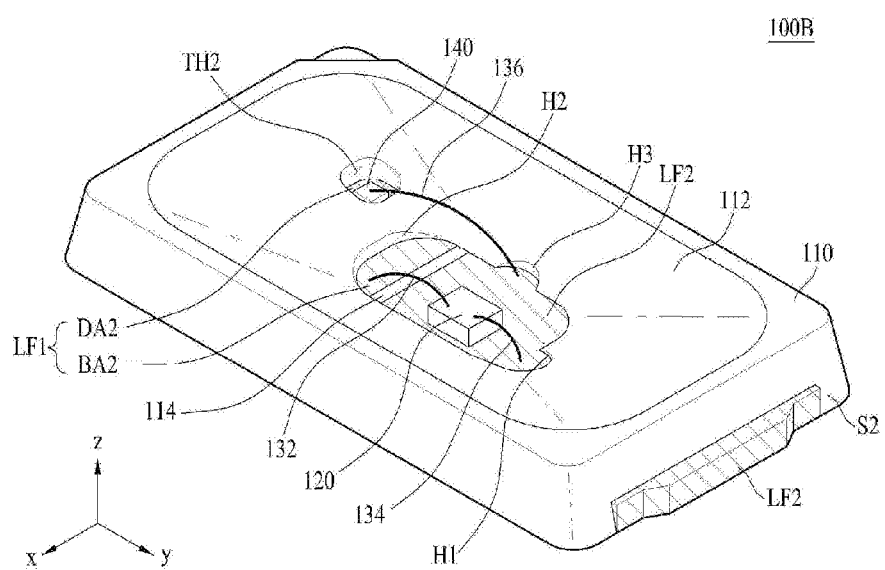
FIG. 14 illustrates a top perspective view of a light-emitting device package according to another embodiment.
Figure 15:
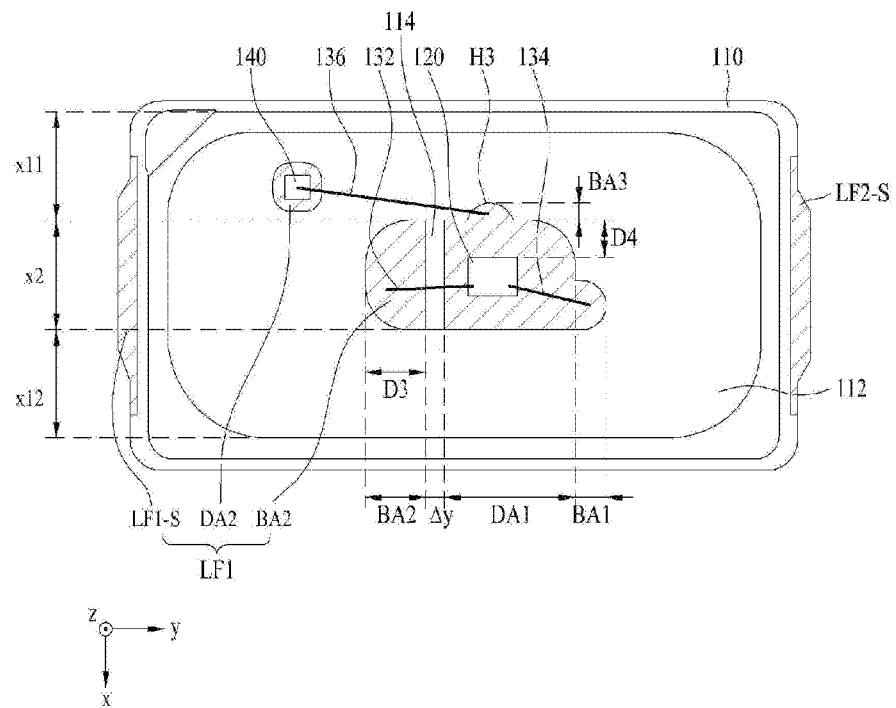
FIG. 15 illustrates a plan view of the light-emitting device package illustrated in FIG. 14.

FIG. 14 illustrates a top perspective view of the light-emitting device package 100B according to another embodiment, and FIG. 15 illustrates a plan view of the light-emitting device package 100B illustrated in FIG. 14.

With the exceptions that the package body 110 does not cover the entire insulation layer 114, but covers a portion of the insulation layer 114 and exposes the remaining portion thereof, and that the second bonding area BA2 is not exposed through the first blind hole TH1, but is exposed through a second groove H2, the light-emitting device package 100B illustrated in FIGS. 14 and 15 is substantially the same as the light-emitting device package 100A illustrated in FIGS. 1 and 6a, and thus a description related to the same parts will be omitted and only differences therebetween will be described below.

That is, the front view, the rear view, the left side view, the right side view, and the bottom view of the light-emitting device package 100B are respectively the same as the front view of FIG. 2, the rear view of FIG. 3, the left side view of FIG. 4, the right side view of FIG. 5, and the bottom view of FIG. 7, and thus a repeated description thereof will be omitted.

As illustrated in FIGS. 14 and 15, when the insulation layer 114 is not wholly covered by the package body 110, but is partially exposed, the package body 110 may include the second groove H2, which exposes the second bonding area BA2 of the first lead frame FL1. That is, the second bonding area BA2 may be exposed through the first blind hole TH1, as illustrated in FIGS. 1 and 6a, may be exposed through the third blind hole TH3, as illustrated in FIG. 6b, or may be exposed through the second groove H2, as illustrated in FIGS. 14 and 15. However, the embodiments are not limited thereto. That is, according to another embodiment, it is to be noted that, even when a portion of the insulation layer 114 is exposed as illustrated in FIGS. 14 and 15, the second bonding area BA2 may be exposed through the first blind hole TH1, as illustrated in FIGS. 1 and 6a (or the third blind hole TH3 illustrated in FIG. 6b).

Similar to the first and third grooves H1 and H3 described above, the second groove H2 may be recessed in the inclined surface 112 of the package body 110 on the first lead frame LF1. For example, the second groove H2 may be recessed along the −y-axis in the inclined surface 112 in order to expose the second bonding area BA2 of the first lead frame LF1. The above-described second bonding area BA2 is an area for the bonding of the first wire 132, and therefore may have a surface area greater than the minimum surface area required for wire bonding. An example of the size of the second bonding area BA2 will be described later.

Figure 16:
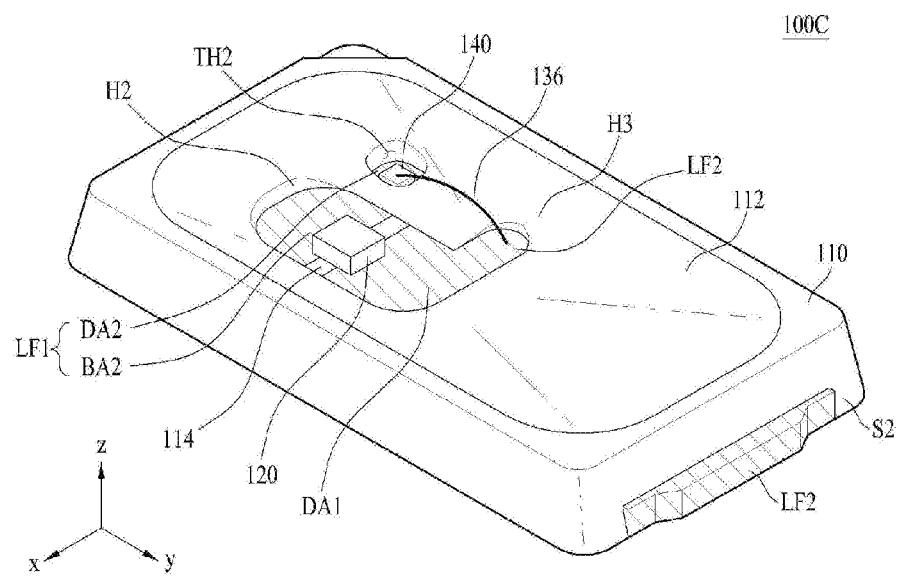
FIG. 16 illustrates a top perspective view of a light-emitting device package according to a further embodiment.
Figure 17:
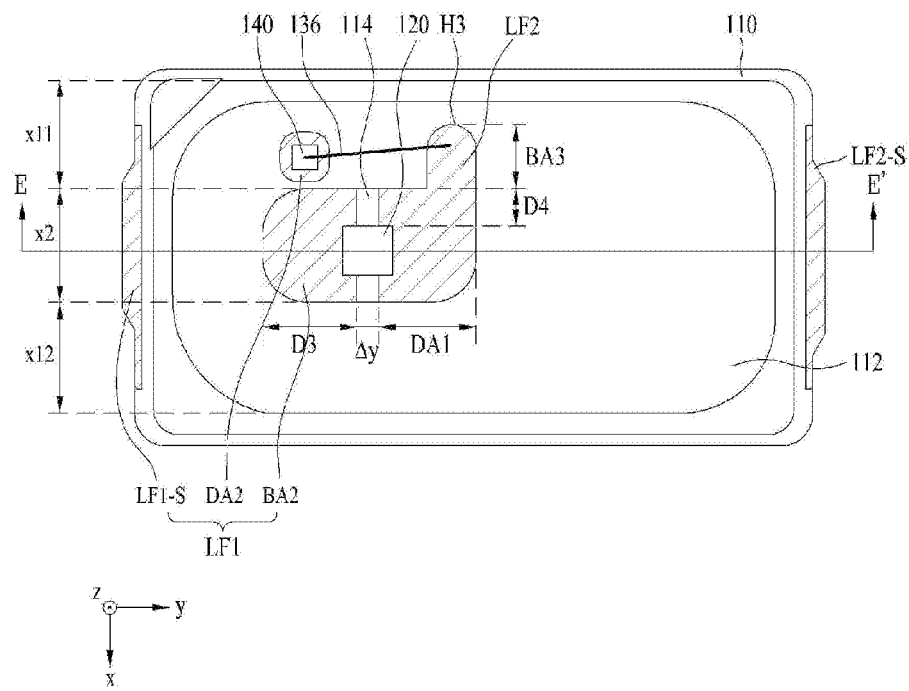
FIG. 17 illustrates a plan view of the light-emitting device package illustrated in FIG. 16.
Figure 18:
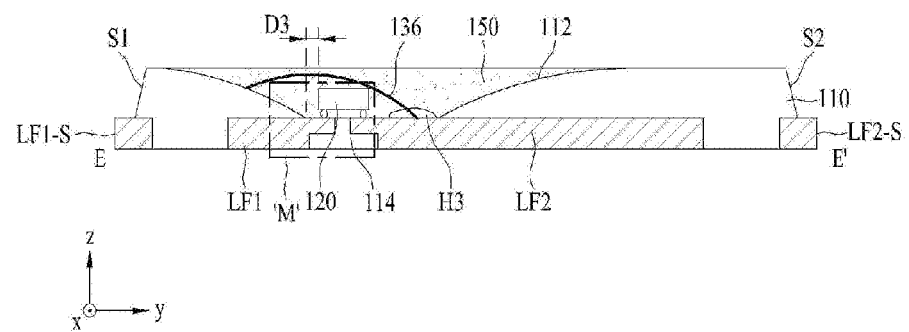
FIG. 18 illustrates a cross-sectional view taken along line E-E' illustrated in FIG. 17.

FIG. 16 illustrates a top perspective view of the light-emitting device package 100C according to still another embodiment, FIG. 17 illustrates a plan view of the light-emitting device package 100C illustrated in FIG. 16, and FIG. 18 illustrates a cross-sectional view taken along line E-E' illustrated in FIG. 17.

With the exceptions that the light-emitting device 120 is not electrically connected to the first and second lead frames LF1 and LF2 via wires, but is directly electrically connected to the first and second lead frames LF1 and LF2, that the first bonding area BA1 and the second wire 134 are omitted, and that the third bonding area BA3 and the second device area DA2 are located at different positions, the light-emitting device package 100C illustrated in FIGS. 16 and 17 is substantially the same as the light-emitting device 100B illustrated in FIGS. 14 and 15, and thus a description related to the same parts will be omitted, and only differences therebetween will be described below.

In addition, the front view, the rear view, the left side view, the right side view, and the bottom view of the light-emitting device package 100C are respectively the same as the front view of FIG. 2, the rear view of FIG. 3, the left side view of FIG. 4, the right side view of FIG. 5, and the bottom view of FIG. 7, and thus a repeated description thereof will be omitted.

Figure 19:
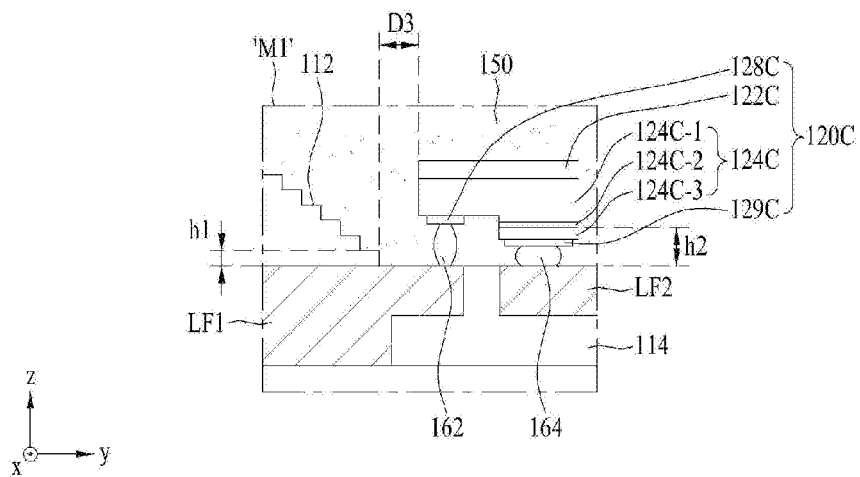
FIG. 19 illustrates an enlarged cross-sectional view of an embodiment of portion "M" illustrated in FIG. 18.
Figure 20:
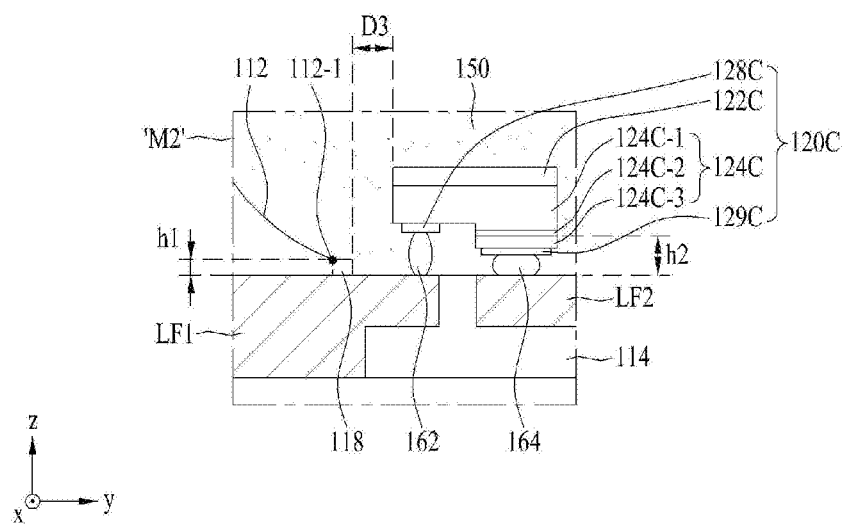
FIG. 20 illustrates an enlarged cross-sectional view of another embodiment of portion "M" illustrated in FIG. 18.

FIG. 19 illustrates an enlarged cross-sectional view of an embodiment M1 of portion "M" illustrated in FIG. 18, and FIG. 20 illustrates an enlarged cross-sectional view of another embodiment M2 of portion "M" illustrated in FIG. 18.

In the case of the light-emitting device packages 100A and 100b according to the above-described embodiments, the light-emitting devices 120, 120A and 120B may have a horizontal bonding-type structure, as illustrated in FIG. 10a, or may have a vertical bonding-type structure, as illustrated in FIG. 10b.

According to the still another embodiment, when the package body 10 does not cover the entire insulation layer 114, but covers only a portion of the insulation layer 114, the light-emitting device 120C may have a flip-chip-bonding-type structure, as illustrated in FIGS. 17 to 20.

The light-emitting device 120C having a flip-chip-bonding-type structure may include a substrate 122C, a light-emitting structure 124C, and first and second electrodes 128C and 129C. Here, the substrate 122C, the light-emitting structure 124C, and the first and second electrodes 128C and 129C perform the same roles as the substrate 122A, the light-emitting structure 124A, and the first and second electrodes 128A and 129A illustrated in FIG. 10a, respectively, and thus a repeated description thereof will be omitted. That is, the first conductive semiconductor layer 124C-1, the active layer 124C-2, and the second conductive semiconductor layer 124C-3 perform the same roles as the first conductive semiconductor layer 124A-1, the active layer 124A-2, and the second conductive semiconductor layer 124A-3 illustrated in FIG. 10a respectively.

However, since the light-emitting device 100C illustrated in FIGS. 19 and 20 has a flip-chip-bonding-type structure, the light emitted from the active layer 124C-2 may be emitted through the first electrode 128C, the first conductive semiconductor layer 124C-1, and the substrate 122C. To this end, the first electrode 128C, the first conductive semiconductor layer 124C-1, and the substrate 122C may be formed of materials that transmit light. At this time, the second conductive semiconductor layer 124C-3 and the second electrode 129C may be formed of materials that transmit light or do not transmit light, or materials that reflect light, but the embodiment is not limited to specific materials.

In addition, each of the first and second electrodes 128C and 129C may be formed of materials that may not absorb the light emitted from the active layer 124C-2, but that may reflect or transmit the light, and that may be grown so as to have a high quality on the first and second conductive semiconductor layers 124C-1 and 124C-3. For example, each of the first and second electrodes 128C and 129C may be formed of a metal, and may be formed of Ag, Ni, Al, Rh, Pd, Ir, Ru, Mg, Zn, Pt, Au, Hf, or selective combinations thereof.

In addition, the light-emitting device package 100C according to the still another embodiment may further include first and second solder portions 162 and 164.

The first solder portion 162 may be disposed between the first electrode 128C of the light-emitting device 120C and the first lead frame LF1, and may electrically connect the first electrode 128C and the first lead frame LF1 to each other. Here, the first lead frame LF1, on which the first solder portion 162 is disposed, may be close to the remaining portion of the insulation layer 114, which is not covered by the package body 110 and is exposed.

In addition, the second solder portion 164 may be disposed between the second electrode 129C of the light-emitting device 120C and the second lead frame LF2, and may electrically connect the second electrode 129C and the second lead frame LF2 to each other. Here, the second lead frame LF2, on which the second solder portion 164 is disposed, may be close to the remaining portion of the insulation layer, which is not covered by the package body 110 and is exposed.

Each of the first solder portion 162 and the second solder portion 164 may be solder paste or a solder ball.

The light-emitting device 120C illustrated in FIGS. 19 and 20 are merely given by way of example, and the embodiment is not limited thereto. That is, the light-emitting device package 100C may include various other shapes of light-emitting devices having a flip-chip-bonding-type structure, unlike that illustrated in FIGS. 19 and 20.

Meanwhile, in each of the light-emitting device packages 100A, 100B and 100C described above, each of the first and second device areas DA1 and DA2 may have a polygonal, circular or oval planar shape depending on the purposes and designs thereof, but the embodiment is not limited as to the shape of the first and second device areas DA1 and DA2. For example, as illustrated in FIGS. 1, 6a, 6b and 14 to 17, each of the first and second device areas DA1 and DA2 may have a rectangular planar shape having rounded corners.

In addition, in the light-emitting device packages 100A, 100B and 100C according to the embodiments, the inclined surface 112 of the package body 110 may define a cavity C together with the exposed front surface of at least one of the first or second lead frame LF1 or LF2, and may reflect the light emitted from the light-emitting devices 120, 120A, 120B and 120C. That is, the inclined surface 112 of the package body 110 may define the cavity C together with the front surface of at least one of the first or second lead frame LF1 or LF2, which is not covered by the package body 110 and is exposed.

In addition, the inclined surface 112 may be disposed on the periphery of the light-emitting devices 120, 120A, 120B and 120C. The light-emitting devices 120, 120A and 120B may be disposed in the first device area DA1 of the exposed front surface of the second lead frame LF2 inside the cavity C, and the light-emitting device 120C may be disposed over the exposed front surfaces of the first and second lead frames LF1 and LF2, which is exposed inside the cavity C.

In addition, the shape of the cavity C viewed from the top may be a circular, polygonal, oval, cup, or concave container shape, and the inclined surface 112 of the package body 110 may be orthogonal to or inclined relative to at least one exposed front surface (or exposed top surface) of the first or second lead frame LF1 or LF2. For example, referring to FIG. 8, the second angle θ2 between the inclined surface 112 and the top surface of the second lead frame LF2 may be an acute angle. That is, the second angle θ2 may be greater than 0° and smaller than 90°, and may be, for example, 30° or less, but the embodiment is not limited thereto.

When the inclined surface 112 of the package body 110 is inclined relative to the bottom surface of the cavity C (i.e. the top surface of the second lead frame LF2 illustrated in FIG. 8 and the top surface of the first lead frame LF1 illustrated in FIG. 11), the width W of the cavity C may be increased with increasing distance from the bottom surface of the cavity C (i.e. in the +z-axis). That is, the width W of the cavity C may be the smallest at the bottom surface of the cavity C on which the light-emitting device 120 is disposed and may be the greatest at the top surface of the package body 110.

In addition, the inclined surface 112 may reflect the light emitted from the light-emitting devices 120, 120A, 120B and 120C. In this case, the reflectance of the inclined surface 112 may be greater than the reflectance of the exposed front surface of at least one of the first or second lead frame LF1 or LF2. For example, at least one of the first or second lead frame LF1 or LF2, which is not covered by the package body 110 and is exposed, may be formed of a reflective material, for example, silver (Ag), in order to reflect the light emitted from the light-emitting device 120, and the inclined surface 112 may be formed of a resin material such as polyphthalamide (PPA) having reflectance higher than that of the first or second lead frame LF1 or LF2.

In addition, the inclined surface 112 of the package body 110 may have a concave shape, a convex shape, or a stepped shape toward the cavity C. For example, the inclined surface 112 may have a convex shape toward the cavity C, as illustrated in FIG. 18, may have a stepped shape toward the cavity C, as illustrated in FIG. 19, or may have a concave shape toward the cavity C, as illustrated in FIG. 20.

It is to be noted that these various shapes of the inclined surface 112 may also be applied to the light-emitting device packages 100A and 100B.

In addition, the package body 110 may further include a stepped portion 118. For example, as illustrated in FIG. 20, the stepped portion 118 may be disposed between the lower end 112-1 of the inclined surface 112 and the bottom surface of the cavity C (e.g. the top surface of the first lead frame LF1). Here, it is to be noted that the stepped portion 118 illustrated in FIG. 20 may also be disposed in the light-emitting device package 100A or 100B according to one embodiment or another embodiment. In addition, it is to be noted that the stepped portion 118 illustrated in FIG. 20 may also be disposed between the lower end of the inclined surface 112 and the top surface of the second lead frame LF2.

In addition, a first height h1 from the bottom surface of the cavity C, i.e. the top surface of the first or second lead frame LF1 or LF2, which is not covered by the package body 110 and is exposed, to the top surface of the stepped portion 118 may be smaller than a second height h2 from the bottom surface of the cavity C to the active layer 124C-2. For example, the first height h1 of the stepped portion 118, illustrated in FIG. 20, may be 50 μm, and the second height h2 from the bottom surface of the cavity C to the active layer 124A-2 or 124B-2 illustrated in FIG. 10a or 10b may range from 100 μm to 150 μm, but the embodiment is not limited thereto.

Meanwhile, the package body 110 may be formed as a silicon-based wafer level package, a silicon substrate, or a silicon carbide (SiC) substrate or aluminum nitride (AlN) substrate having high insulation or thermal conductivity, may be formed of a resin material such as polyphthalamide (PPA) having high reflectance, or may be formed of epoxy molding compound (EMC), but the embodiment is not limited as to the material of the package body 110. When the package body 110 is formed of plastic, discoloration may be prevented.

In addition, the light-emitting device packages 100A, 100B and 100C may achieve increased light extraction efficiency as the distance between the inclined surface 112 and the light-emitting devices 120, 120A, 120B and 120C in the width direction is reduced. This is because the smaller the distance, the smaller the area of the bottom surface of the cavity C and the greater the area of the inclined surface 112, and because the reflectance of the inclined surface 112 is greater than the reflectance of the bottom surface of the cavity C as described above. Here, the width direction may be a direction that crosses the thickness direction of the light-emitting devices 120, 120A, 120B and 120C, and may be, for example, a direction that is orthogonal to the thickness direction of the light-emitting devices 120, 120A, 120B and 120C.

For example, the lower end of the inclined surface 112 that corresponds to the side surface of the cavity C and the light-emitting devices 120, 120A, 120B and 120C disposed on the bottom surface of the cavity C may be spaced apart from each other by a predetermined distance. Here, the predetermined distance may be at least one of the distance D3 along the y-axis or the distance D4 along the x-axis illustrated in FIGS. 6a, 6b, 8, 15, and 17 to 20. When the distances D3 and D4 are smaller than 30 μm, the first device area DA1 may have the processing defects, for example, the first device area DA1 may not be formed to have a desired surface area. Therefore, in consideration of a process margin, each of the distances D3 and D4 may be 30 μm or more. As described above, when each of the distances D3 and D4 is smaller, the surface area of the inclined surface 112 may be greater than the surface area of the bottom surface of the cavity C, which may increase light extraction efficiency. Therefore, each of the distances D3 and D4 may be 30 μm, but the embodiment is not limited thereto.

In addition, when the length of the first bonding area BA1 along each of the x-axis and the y-axis is zero, the other end of the second wire 134 may not have a sufficient surface area for the bonding of the second lead frame LF2. In addition, when the length of the first bonding area BA1 along each of the x-axis and the y-axis is greater than 400 μm, the bottom surface of the cavity C, which has reflectance lower than that of the inclined surface 112, may be excessively exposed, which may deteriorate light extraction efficiency. Thus, the length of the first bonding area BA1 along each of the x-axis and the y-axis may be greater than 0 μm and equal to or less than 400 μm, but the embodiment is not limited thereto.

In addition, when the length of the third bonding area BA3 along each of the x-axis and the y-axis is zero, the other end of the third wire 136 may not have a sufficient surface area for being bonded with the second lead frame LF2. In addition, when the length of the third bonding area BA3 along each of the x-axis and the y-axis is greater than 400 μm, the bottom surface of the cavity C, which has reflectance lower than that of the inclined surface 112, may be excessively exposed, which may deteriorate light extraction efficiency. Thus, the length of the third bonding area BA3 along each of the x-axis and the y-axis may be greater than 0 μm and equal to or less than 400 μm, but the embodiment is not limited thereto.

In addition, for example, when the length of the light-emitting device 120 along each of the x-axis and the y-axis ranges from 100 μm to 1000 μm and the length of the first device area DA1 along each of the x-axis and the y-axis is smaller than 150 μm, the surface area of the portion of the front surface of the second lead frame LF2 in which the light-emitting device 120 is disposed may be reduced. In addition, when the length of the first device area DA1 along each of the x-axis and the y-axis is greater than 1050 μm, the bottom surface of the cavity C, which has reflectance lower than that of the inclined surface 112, may be excessively exposed, which may deteriorate light extraction efficiency. Thus, the length of the first device area DA1 along each of the x-axis and the y-axis may range from 150 μm to 1050 μm, but the embodiment is not limited thereto.

In addition, the minimum value of the length of the second device area DA2 along each of the x-axis and the y-axis is determined depending on the size of the Zener diode 140. In addition, when the length of the second device area DA2 along each of the x-axis and the y-axis is greater than 400 μm, the bottom surface of the cavity C, which has reflectance lower than that of the inclined surface 112, may be excessively exposed, which may deteriorate light extraction efficiency. Thus, the maximum value of the length of the second device area DA2 along each of the x-axis and the y-axis may be 400 μm, but the embodiment is not limited thereto.

Hereinafter, the light-emitting device package 100A according to the embodiment and a light-emitting device package according to a comparative example will be described below with reference to the accompanying drawings.

Figure 21:
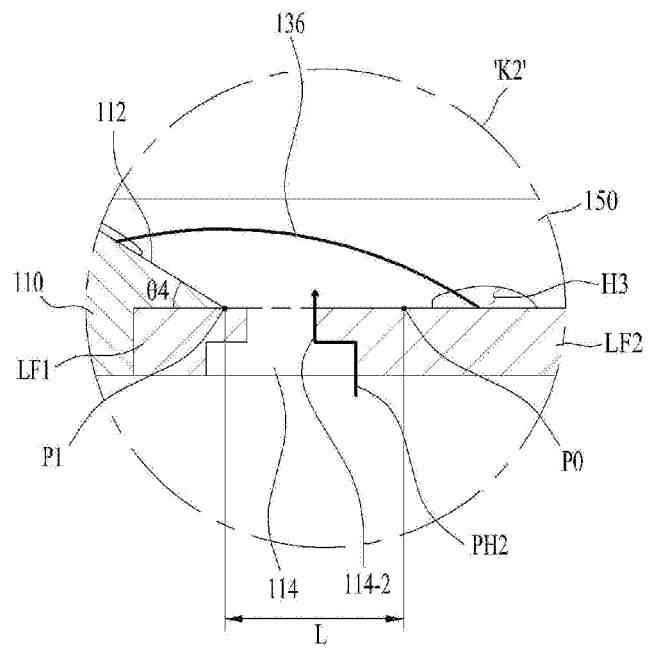
FIG. 21 illustrates an enlarged cross-sectional view of a comparative example of portion "K" illustrated in FIG. 8.

FIG. 21 illustrates an enlarged cross-sectional view of a comparative example K2 of portion "K" illustrated in FIG. 8.

Referring to FIGS. 1, 6a and 6b, the package body 110 covers the entire front surface of the first lead frame LF1 and covers the entire front surface of the insulation layer 114 while exposing the first to third blind holes TH1, TH2 and TH3.

Referring to FIG. 11, the package body 110 covers the first lead frame LF1 and the insulation layer 114. At this time, the package body 110 may cover a region up to the zero point PO of the top surface LFT2 of the second lead frame LF2. In contrast, referring to FIG. 21, the package body 110 covers only a region up to the first point P1 on the top surface of the first lead frame LF1 while exposing a portion of the insulation layer 114 and the first lead frame LF1.

Thus, the third angle θ3 between the inclined surface 112 and the top surface of the second lead frame LF2 illustrated in FIG. 11 is smaller than the fourth angle θ4 between the inclined surface 112 and the top surface of the first lead frame LF1 illustrated in FIG. 21. This means that the surface area of the inclined surface 112 illustrated in FIG. 11 is greater than the surface area of the inclined surface 112 illustrated in FIG. 21. For example, the third angle θ3 may be greater than 0° and smaller than 90°. In addition, the fifth angle θ5 between the inclined surface 112 and the top surface of the second lead frame LF2 illustrated in FIG. 13 is smaller than the fourth angle θ4 between the inclined surface 112 and the top surface of the first lead frame LF1 illustrated in FIG. 21. This means that the surface area of the inclined surface 112 illustrated in FIG. 11 is greater than the surface area of the inclined surface 112 illustrated in FIG. 21. For example, the fifth angle θ5 may be greater than 0° and smaller than 90°.

In addition, the third angle θ3 between the inclined surface 112 and the top surface of the second lead frame LF2 along the major axis (e.g. the y-axis) illustrated in FIG. 11 may be smaller than the fifth angle θ5 between the inclined surface 112 and the top surface of the second lead frame LF2 along the minor axis (e.g. the x-axis) illustrated in FIG. 13. For example, the third angle θ3 may be 30° and the fifth angle θ5 may be 45°, but the embodiment is not limited thereto.

In addition, as the third angle θ3 becomes smaller than the fourth angle θ4 and/or as the fifth angle θ5 becomes smaller than the fourth angle θ4, that is, as the area covered by the package body 110 increases, the surface area of the inclined surface 112 increases. In this way, as the exposed area of the second lead frame LF2 that is not covered by the package body 110 decreases and the surface area of the inclined surface 112 increases, the light reflection ability of the light-emitting device package 100A increases, which increases light extraction efficiency. This is because the reflectance of the inclined surface 112 is greater than the reflectance of each of the first and second lead frames LF1 and LF2.

In addition, referring to FIG. 21, outside air such as moisture may permeate into the cavity C of the light-emitting device package from the outside in the arrow direction PH2 through the second boundary 114-2 between the insulation layer 114 and the second lead frame LF2. Due thereto, the reliability of the light-emitting device package may be reduced.

However, as illustrated in FIG. 11, when the package body 110 is disposed so as to cover both the first and second boundaries 114-1 and 114-2, the length of the path, along which outside air is introduced from the outside into the cavity C of the light-emitting device package 100A in the arrow direction PH1 through the second boundary 114-2, may be increased, and the introduction path becomes more crooked. That is, compared to the light-emitting device package illustrated in FIG. 21, the light-emitting device package 100A illustrated in FIG. 11 may further increase the length of the introduction path PH1 of the outside air into the cavity C and may cause the introduction path PH1 to be more crooked, which makes it difficult for the outside air to permeate. Therefore, the reliability of the light-emitting device package 100A illustrated in FIG. 11 may be improved relative to the light-emitting device package illustrated in FIG. 21.

In addition, in the case of the light-emitting device package according to the comparative example illustrated in FIG. 21, the package body 110 is disposed so as to expose a portion of the first lead frame LF1 and to expose the entire insulation layer 114. Therefore, when the thicknesses of the first and second lead frames LF1 and LF2 are not secured to some extent, the first and second lead frames LF1 and LF2 may not be sufficiently rigid. To prevent this, for example, the thicknesses of the first and second lead frames LF1 and LF2 need to be greater than 250 μm.

On the other hand, when the first planar area, which will be described below, is equal to or greater than the second planar area, in particular, in the case of the light-emitting device package 100A according to the embodiment illustrated in FIG. 11, the package body 110 is disposed so as to cover the entire front surface of the first lead frame LF1, excluding the portion exposed through the first and second blind holes TH1 and TH2 (or the third blind hole TH3), to cover the entire front surface of the insulation layer 114, and to cover a portion of the front surface of the second lead frame LF2. As the area covered by the package body 110 increases, the package body 110 may supplement the rigidity of the first and second lead frames LF1 and LF2, whereby the thicknesses of the first and second lead frames LF1 and LF2 may be reduced. Thus, according to the embodiment, even when the thicknesses of the first and second lead frames LF1 and LF2 are reduced, since the package body 110 is disposed on the first lead frame LF1 and the insulation layer 114, that is, since the first planar area is equal to or greater than the second planar area, the structural rigidity of the light-emitting device package 100A may be increased. For example, according to the embodiment, even when the thicknesses of the first and second lead frames LF1 and LF2 are 250 μm or less, the rigidity of the first and second lead frames LF1 and LF2 may be secured.

For example, referring to FIG. 8, when the second thickness t2 of the first lead frame LF1, the third thickness t3 of the insulation layer 114, and the fourth thickness t4 of the second lead frame LF2 are the same, the minimum value of the sum of the second, third or fourth thickness t2, t3 or t4 and the fifth thickness t5 of the package body 110, which is disposed on the insulation layer 114 and the first lead frame LF1, may be 250 μm, but the embodiment is not limited thereto.

In addition, the second, third and fourth thicknesses t2, t3 and t4 may be the same as or different from each other.

Hereinafter, the planar area of the insulation layer 114 that is covered by the package body 110 is referred to as the "first planar area", and the planar area of the insulation layer 114 that is not covered by the package body 110 and is exposed is referred to as the "second planar area".

Referring to FIG. 15 or FIG. 17, the first planar area of the portion of the insulation layer 114 that is covered by the package body 110 may be represented by the following Equation 1, and the second planar area of the remaining portion of the insulation layer 114 that is exposed through the package body 110 may be represented by the following Equation 2.

Equation 1

$$TA1=(x11+x12)\times\Delta y \quad \text{[Formula 1]}$$

Equation 2

$$TA2=x2\times\Delta y \quad \text{[Formula 2]}$$

Here, TA1 and TA2 designate the first and second planar areas, respectively, x11 designates the length of an upper end portion of the insulation layer 114 that is covered by the package body 110 along the x-axis, x12 designates the length of a lower end portion of the insulation layer 114 that is covered by the package body 110 along the x-axis, x2 designates the length of a portion of the insulation layer 114 that is not covered by the package body 110 and is exposed along the x-axis, and Δy designates the length of the insulation layer 114 along the y-axis. In the case of the light-emitting device package 100A according to the embodiment, x2 is "0".

In addition, referring to FIGS. 15 and 17, the package body 110 is illustrated as exposing a middle portion of the insulation layer 114. Thus, the distance x11 or x12 from the tip end of the exposed insulation layer 114 to the edge of the cavity C may be greater than "0", but the embodiment is not limited thereto. According to another embodiment, x11 or x12 may be "0".

As described above, so long as the exposed portion of the bottom surface of the cavity C (i.e. the exposed front surface of at least one of the first or second lead frame LF1 or LF2) is minimized, thereby increasing the surface area of the inclined surface 112 so as to increase light extraction efficiency and so long as the length of the introduction path of the outside air is increased so as to increase the reliability and and so as to secure rigidity of the light-emitting device package, the package body 110 may cover the entire insulation layer 114, as in the light-emitting device package 100A according to the embodiment, or may cover only a portion of the insulation layer 114, as in the light-emitting device packages 100B and 100C according to the other embodiments. To this end, the first planar area TA1 may be equal to or greater than the second planar area TA2, but the embodiment is not limited thereto. In addition, in the case of the light-emitting device package 100A according to the embodiment, since the package body 110 covers the entire insulation layer 114 and there is no exposed insulation layer 114 that is not covered with the package body 110, the second planar area becomes "0". Therefore, even in the case of the light-emitting device package 100A according to the embodiment, it can be appreciated that the first planar area is greater than the second planar area.

In conclusion, compared to the case where the first planar area is smaller than the second planar area, since, when the first planar area is equal to or greater than the second planar area, as in the embodiment, the surface area of the inclined surface 112, which has reflectance greater than the reflectance of the bottom surface of the cavity C, increases, light extraction efficiency may be increased and the rigidity of the lead frames LF1 and LF2 may be increased.

In addition, in the light-emitting device packages 100A, 100B and 100C according to the above-described embodiments, for example, referring to FIG. 11, the top surface LFT1 of the first lead frame LF1, the top surface LFT2 of the second lead frame LF2, and the top surface 114T of the insulation layer 114 may not be stepped, but may be disposed in the same plane, but the embodiment is not limited thereto. That is, according to another embodiment, the top surface LFT1 of the first lead frame LF1, the top surface LFT2 of the second lead frame LF2, and the top surface 114T of the insulation layer 114 may be stepped, unlike the illustration.

Meanwhile, for the convenience of description, the illustration of the molding member 150 is omitted in FIGS. 1, 6a, 6b, 9, and 14 to 17. However, as illustrated in FIGS. 8, 11, 12, 13, and 18 to 20, the light-emitting device packages 100A, 100B and 100C according to the embodiments may further include the molding member 150. The molding member 150 may surround and protect the light-emitting devices 120, 120A, 120B, and 120C.

The molding member 150 may be formed of, for example, a transparent polymer resin such as silicon (Si), and may include phosphors, and therefore may change the wavelength of the light emitted from the light-emitting devices 120, 120A, 120B and 120C. The phosphors may include a fluorescent substance, which serves as a wavelength change material capable of changing light emitted from the light-emitting devices 120, 120A, 120B and 120C into white light, for example, any one of YAG-based, TAG-based, silicate-based, sulfide-based, or nitride-based fluorescent substances, but the embodiment is not limited as to the kind of phosphors.

The YGA-based and TAG-based fluorescent substances may be selected and used from among (Y, Tb, Lu, Sc, La, Gd, Sm)3(Al, Ga, In, Si, Fe)5(O, S)12:Ce, and the silicate-based fluorescent substance may be selected and used from among (Sr, Ba, Ca, Mg)2SiO4:(Eu, F, Cl).

In addition, the sulfide-based fluorescent substance may be selected and used from among (Ca, Sr)S:Eu, (Sr, Ca, Ba)(Al, Ga)2S4:Eu, and the nitride-based phosphors are at least one material of (Sr, Ca, Si, Al, 0)N:Eu (e.g. CaAlSiN4: Eu β-SiAlON:Eu) or Ca-α SiAlON:Eu-based (Cax, My)(Si, Al)12(O, N)16 (here, M is at least one material of Eu, Tb, Yb or Er, 0.05<(x+y)<0.3, 0.02<X<0.27 and 0.03<y<0.3).

Red phosphors may include nitride-based phosphors including N (e.g. CaAlSiN3:Eu). Such nitride-based red phosphors may have higher reliability to withstand external environments such as heat and moisture and lower discoloration possibility than sulfide-based phosphors.

The light-emitting device packages 100A, 100B and 100C may further include a lens (not illustrated) disposed on the molding member 150. The lens (not illustrated) may adjust the distribution of light emitted from the light-emitting device packages 100A, 100B and 100C.

A plurality of light-emitting device packages according to the embodiments may be disposed on a substrate to form an array, and optical members, such as a light guide plate, a prism sheet, and a diffusion sheet may be disposed on the optical path of the light-emitting device packages. The light-emitting device packages, the substrate, and the optical members may function as a backlight unit.

In addition, a display apparatus, an indicator apparatus, and a lighting apparatus including the light-emitting device packages according to the embodiments may be realized.

Here, the display apparatus may include a bottom cover, a reflector disposed on the bottom cover, a light-emitting module configured to emit light, a light guide plate disposed in front of the reflector to forwardly guide the light emitted from the light-emitting module, optical sheets including prism sheets disposed in front of the light guide plate, a display panel disposed in front of the optical sheets, an image signal output circuit connected to the display panel so as to supply an image signal to the display panel, and a color filter disposed in front of the display panel. Here, the bottom cover, the reflector, the light-emitting module, the light guide plate, and the optical sheets may construct a backlight unit.

In addition, the lighting apparatus may include a light source module having a substrate and a light-emitting device package according to the embodiments, a heat radiator configured to dissipate heat from the light source module, and a power supply unit configured to process or convert an electric signal provided from the outside so as to supply the same to the light source module. For example, the lighting apparatus may include a lamp, a headlamp, or a street light.

The head lamp may include a light-emitting module, which includes light-emitting device packages disposed on a substrate, a reflector, which reflects light emitted from the light-emitting module in a given direction, for example, in a forward direction, a lens, which forwardly refracts the light reflected by the reflector, and a shade, which blocks or reflects some of the light, which has been reflected by the reflector and directed to the lens, so as to achieve the light distribution pattern desired by a designer.

Although embodiments have been described above, the above description is merely given by way of example and is not intended to limit the disclosure, and it will be apparent to those skilled in the art that various modifications and applications, which are not exemplified above, may be devised without departing from the essential characteristics of the embodiments. For example, the respective constituent devices described in the embodiments may be modified in various ways. In addition, differences associated with these modifications and alterations should be interpreted as being included in the scope of the disclosure defined by the accompanying claims.

Modes for the implementation of embodiments have sufficiently been described in the "best mode" described above.

A light-emitting device package according to embodiments may be used in a display apparatus, an indicator apparatus, and a lighting apparatus.

What is claimed is:

1. A light-emitting device package, comprising:
a first lead frame;
a second lead frame separated from the first lead frame in a first direction;
a package body having a cavity exposing a portion of the second lead frame, wherein the cavity comprises an inclined inner surface inclining with respect to an upper surface of the second lead frame;
a light-emitting diode disposed on the exposed portion of the second lead frame;
a hole in the inclined inner surface of the cavity and exposing a portion of the first lead frame;
a protection device disposed in the hole and on the exposed portion of the first lead frame;
a first wire having a first end connected to the light-emitting diode, and a second end connected to the first lead frame;
a second wire having a first end connected to the light-emitting diode, and a second end connected to the second lead frame; and
a third wire having a first end connected to the protection device, and a second end connected to the exposed portion of the second lead frame,
wherein the package body includes an insulation portion disposed between the first lead frame and the second lead frame,
wherein the package body further includes a first portion disposed between the protection device and the light-emitting diode,
wherein the first portion of the package body includes a first surface corresponding to the inclined inner surface, wherein the first surface is inclining at a first acute angle with respect to the upper surface of the second lead frame, and wherein the first surface is facing the light-emitting diode,
wherein the third wire is disposed on the first portion of the package body,
wherein a first central imaginary line extending in the first direction passes through a center of the light-emitting diode,
wherein a first distance is from the first central imaginary line to a first inner edge of the inclined inner surface in a second direction perpendicular to the first central imaginary line,
wherein a second distance is from the first central imaginary line to a second inner edge of the inclined inner surface in a third direction opposite to the second direction,
wherein a first maximum distance of the first distance is greater than a second maximum distance of the second distance,
wherein the second end of the third wire is disposed on the exposed portion of the second lead frame between the first central imaginary line and the first inner edge of the inclined inner surface, and
wherein the second end of the third wire is disposed adjacent to a corner portion of the exposed portion of the second lead frame.

2. The light-emitting device package according to claim 1, wherein the first distance includes a first minimum distance and the first maximum distance, and wherein the second end of the third wire is disposed on the exposed portion of the second lead frame between the first minimum distance and the first maximum distance.

3. The light-emitting device package according to claim 2, wherein the exposed portion of the second lead frame between the first minimum distance and the first maximum distance includes a rounded outer edge extending in the second direction.

4. The light-emitting device package according to claim 3, wherein the exposed portion of the second lead frame between the first minimum distance and the first maximum distance is disposed at the corner portion of the exposed portion of the second lead frame.

5. The light-emitting device package according to claim 2, wherein an area between the first minimum distance and the first maximum distance comprises a grooved area extending the exposed portion of the second lead frame.

6. The light-emitting device package according to claim 1, wherein a difference between the first distance and the second distance is less than 400 micrometers.

7. The light-emitting device package according to claim 6, wherein a second central imaginary line extending in the second direction passes through the center of the light-emitting diode,
wherein a third distance is from the second central imaginary line to a third inner edge of the inclined inner surface in a fourth direction perpendicular to the second central imaginary line,
wherein a fourth distance is from the second central imaginary line to a fourth inner edge of the inclined inner surface in a fifth direction opposite to the fourth direction, and
wherein a third maximum distance of the third distance is greater than a fourth maximum distance of the fourth distance.

8. The light-emitting device package according to claim 1, wherein a width of the exposed portion of the first lead frame by the hole is less than 400 micrometers in the first direction.

9. The light-emitting device package according to claim 8, wherein the second end of the first wire is inserted into the hole and connected to the first lead frame.

10. The light-emitting device package according to claim 9, wherein the first end of the second wire is connected to an electrode of the light-emitting diode, and the second end of the second wire is connected to the exposed portion of the second lead frame.

11. The light-emitting device package according to claim 10, wherein the protection device is disposed closer to a first imaginary line extending in the first direction along an outer edge of the light-emitting diode than a second imaginary line extending in the first direction through the center of the light-emitting diode and being parallel to the first imaginary line.

12. The light-emitting device package according to claim 11, wherein the exposed portion of the first lead frame comprises a device area and the protection device is disposed on the device area, and
wherein the second imaginary line passes through the device area.

13. The light-emitting device package according to claim 12, wherein the second end of the second wire is connected to the second lead frame exposed by a groove, and
wherein the second imaginary line is spaced apart from the groove.

14. The light-emitting device package according to claim 12, further comprising:
a molding member disposed in the cavity,
wherein the molding member surrounds and protects the light-emitting diode, and
wherein the molding member includes phosphor.

15. The light-emitting device package according to claim 11, wherein the first acute angle is less than 30 degrees.

16. The light-emitting device package according to claim 15, wherein the hole is spaced apart from the exposed portion of the second lead frame by a first predetermined distance in the first direction,
wherein the fourth inner edge of the inclined inner surface closest to the hole is spaced apart from the light-emitting diode by a second predetermined distance in the first direction, and
wherein a minimum distance of the first predetermined distance is greater than a minimum distance of the second predetermined distance.

17. The light-emitting device package according to claim 16, wherein the first predetermined distance is greater than or equal to 50 micrometers.

18. The light-emitting device package according to claim 17, wherein the minimum distance of the second predetermined distance is greater than or equal to 30 micrometers.

19. The light-emitting device package according to claim 18, wherein bottom surfaces of the first lead frame and the second lead frame are exposed on a bottom surface of the package body.

20. The light-emitting device package according to claim 1, further comprising:
another hole in the inclined inner surface of the cavity and exposing another portion of the first lead frame,
wherein the second end of the first wire is inserted into the another hole and connected to the exposed another portion of the first lead frame, and the first end of the first wire is connected to an electrode of the light-emitting diode.

21. The light-emitting device package according to claim 1, wherein the first portion of the package body further includes a second surface facing the protection device in the hole, and
wherein the second surface is inclining at a second acute angle with respect to an upper surface of the first lead frame.

22. The light-emitting device package according to claim 21, wherein a highest height of the first portion of the package body is greater than a height of the light-emitting diode disposed on the exposed portion of the second lead frame.

23. The light-emitting device package according to claim 22, wherein the highest height of the first portion of the package body is higher than a height of the protection device.

24. The light-emitting device package according to claim 21, wherein the second acute angle is greater than the first acute angle.

25. The light-emitting device package according to claim 21, wherein the first surface of the first portion of the package body is spaced apart from the light-emitting diode by a first separation distance,
wherein the second surface of the first portion of the package body is spaced apart from the protection device by a second separation distance,
wherein a highest point of the first portion is between the first surface and the second surface, and
wherein a minimum distance of the first separation distance is greater than a minimum distance of the second separation distance.

26. The light-emitting device package according to claim 25, wherein a height of the first portion decreases along the first surface progressing from the highest point, and
wherein the height of the first portion decreases along the second surface progressing from the highest point.

27. The light-emitting device package according to claim 26, wherein the hole is spaced from an inner edge including the first and second inner edges and an outer edge of the inclined inner surface of the cavity,
wherein the inclined inner surface extends between an outer edge and an inner edge along a same imaginary line, and
wherein an inclined surface between the outer edge and the hole and an inclined surface between the outer edge and the hole are disposed on a same plane.

28. The light-emitting device package according to claim 1, wherein the inclined inner surface of the cavity extends from an outer edge of the cavity to an inner edge of the cavity,
wherein the inner edge includes the first and second inner edges,
wherein the inner edge of the cavity does not expose the first lead frame, and
wherein the hole does not expose the second lead frame.

29. The light-emitting device package according to claim 28, wherein the insulation portion and the package body are integrally formed with each other,
wherein top surfaces of the first lead frame, the insulation portion and the second lead frame are substantially flush, and
wherein the first portion of the package body contacts the insulation portion and is vertically overlapped with the first lead frame and the second lead frame.

30. The light-emitting device package according to claim 1, wherein the light-emitting diode includes a first electrode electrically connected to the first lead frame via the first wire and a second electrode electrically connected to the second lead frame via the second wire,
wherein the inclined inner surface of the cavity reflect lights emitted from the light-emitting diode, and an inner edge of the inclined inner surface including the first and second inner edges is spaced apart from the light-emitting diode disposed on the exposed portion of the second lead frame, and
wherein the inclined inner surface of the cavity has a reflectance higher than a reflectance of the exposed portion of the second lead frame.

* * * * *